United States Patent [19]
Narumi et al.

[11] Patent Number: 6,108,290
[45] Date of Patent: *Aug. 22, 2000

[54] METHOD AND APPARATUS FOR WRITING AND READING OPTICAL RECORDING MEDIUM

[75] Inventors: Kenji Narumi; Kenichi Nishiuchi, both of Osaka, Japan

[73] Assignee: Matsushita Electric Industrial Co., Ltd., Osaka, Japan

[*] Notice: This patent is subject to a terminal disclaimer.

[21] Appl. No.: 09/449,685

[22] Filed: Nov. 24, 1999

Related U.S. Application Data

[63] Continuation of application No. 08/864,770, May 29, 1997, Pat. No. 6,031,800.

[30] Foreign Application Priority Data

May 31, 1996 [JP] Japan ................................ 8-138591

[51] Int. Cl.[7] .................................................. G11B 7/006
[52] U.S. Cl. ......................................... 369/59; 369/54
[58] Field of Search .............................. 369/47–48, 54, 369/58, 59, 124.07–124.08, 124.14

[56] References Cited

U.S. PATENT DOCUMENTS

| | | |
|---|---|---|
| 5,216,657 | 6/1993 | Nishiuchi et al. . |
| 5,490,126 | 2/1996 | Furumiya et al. . |
| 5,636,194 | 6/1997 | Furumiya et al. . |
| 5,712,837 | 1/1998 | Horigome et al. ................ 369/59 |
| 5,748,586 | 5/1998 | Kobayashi et al. ................ 369/48 |

FOREIGN PATENT DOCUMENTS

| | | |
|---|---|---|
| 0 628 952 | 12/1994 | European Pat. Off. . |
| 0 648 049 | 4/1995 | European Pat. Off. . |
| 63-229625 | 9/1988 | Japan . |
| 2-94113 | 4/1990 | Japan . |
| 4-153919 | 5/1992 | Japan . |
| 5-101389 | 4/1993 | Japan . |
| 5-234079 | 9/1993 | Japan . |
| 5-274675 | 10/1993 | Japan . |
| 6-295440 | 10/1994 | Japan . |
| 8-287465 | 11/1996 | Japan . |

*Primary Examiner*—W. R. Young
*Attorney, Agent, or Firm*—Merchant & Gould P.C.

[57] ABSTRACT

An apparatus for writing on and reading an overwritable optical disk comprises an identifier detector that identifies a recording condition in the sector to be overwritten, and a delay time controller circuit that sets a variation range of the start point for writing according to the recording condition. The record timing of the modulated data signal is changed at random within the set variation range when overwriting the sector of the optical disk.

1 Claim, 34 Drawing Sheets

METHOD AND APPARATUS FOR WRITING AND READING OPTICAL RECORDING MEDIUM

This application is a Continuation of application Ser. No. 08/864,770, filed May 29, 1997, now U.S. Pat. No. 6,031,800, which application is incorporated herein by reference.

BACKGROUND OF THE INVENTION

The present invention relates to a method and apparatus for writing on and reading an optical recording medium.

Recently, optical disks, cards and tapes are developed and have been used for recording information optically. Especially, optical disks are given attention as a medium having large capacity and high density.

A conventional method for writing an optical disk is explained below referring to the figures. FIG. 27 shows an example of an optical disk using a phase-change type recording film. A substrate 2301, which is made of a glass or plastic material such as PMMA or polycarbonate, is provided with guide grooves 2302 and pits indicating an address or other information. This area with the pit train is called the ID area. The guide grooves are formed in concentric circles or a coil from the inner to outer portions of the substrate. Areas 2307 between the grooves are called lands. The ID areas are located at a predetermined pitch along the guide grooves. The areas between the ID areas are called sectors. A surface of the substrate 2301 is provided with layers of a protective film 2303, a recording film 2304 and a reflection film 2305 formed by sputtering or other methods. Furthermore, a protective sheet is glued onto the layers.

A method for writing on and reading the above-mentioned optical recording medium is explained below referring to the figures. FIG. 28 shows a block diagram of a conventional writing and reading apparatus. FIG. 29 shows the write and read operation for an optical disk. In FIG. 29, (a) indicates a write data signal, (b) indicates a laser-driving signal (corresponding to a laser power), (c) indicates a recorded state of the optical disk, and (d) indicates a record format.

The reading process for the optical disk is performed as follows. A system controller circuit 101 drives a spindle motor 114 that rotates the optical disk 113. An optical head 112 focuses a laser beam with a weak power (Pr in FIG. 29) to irradiate the optical disk 113, tracking the guide groove 2302 and the pit train 2502 shown in (c) of FIG. 29. The intensity of the beam reflected by the optical disk 113 varies in accordance with the existence of the pit train 2502 and record marks 2501. Detecting the intensity of the reflected beam generates read signal 122, which is processed into binary data by a read signal processor circuit 115 and demodulated by a demodulator circuit 116. Then the signal is processed in an error correction and deinterleaving circuit 117 to obtain read data. The deinterleaving process restores the original data from the interleaved data, which are changed in order.

The writing process for the optical disk is performed as follows. A system controller circuit 101 connected to a host computer gives write data 102 to an error correction and interleaving circuit 103, which adds error correcting data, i.e., parity bits to the write data, and performs an interleaving process. The interleaving process makes error correction easy by converting a burst error (long continuous error) due to a defect of the optical disk into a random error (short error). The write data are divided into blocks and the order of the blocks is changed according to a predetermined rule in the interleaving process. Then a modulator circuit 104 modulates the data in accordance with the (1, 7) RLL modulation method, for example. Consequently, a modulated data signal 105 is obtained for writing the data area 604 shown in (d) of FIG. 29.

In the synthesizer circuit 109, each data block to be written into each sector is provided with VFO and RESYNC signals from a synchronizing signal generator circuit 108 as well as dummy data from a dummy data generator circuit 107 if necessary, to make the write data signal 118. The VFO and RESYNC are synchronizing signals for generating a clock signal synchronizing with the read signal in a PLL circuit (synchronizing signal generator) in the read signal processor circuit 115. The VFO signal is added to the head of the modulated data, and the RESYNCH signal is added in the modulated data signal at a predetermined interval. The dummy data are added for reducing a deterioration of the recording film generated at the end of writing when writing on the same sector repeatedly. The dummy data is not required to include any information. The example of the write data signal 118 is shown in (a) of FIG. 29.

Corresponding to the write data signal 118, the laser driver circuit 110 generates a laser driving signal 111 to drive a laser in the optical head 112, modulating the intensity of the laser beam. An example of the laser-driving signal 111 is shown in (b) of FIG. 29.

When the optical head 112 irradiates the recording film of the optical disk 113 with the focused laser beam having a high intensity (Pp shown in (b) of FIG. 29) for a predetermined period, the temperature of the recording film rises above the melting point and drops rapidly. As a result, the melted spot becomes a recorded mark 2501 (shown in (c) of FIG. 29) having an amorphous state due to rapid cooling. On the contrary, when the recording film is irradiated with the focused laser beam having a middle intensity (Pb shown in (b) of FIG. 29) for a predetermined period, the temperature of the recording film rises to the temperature below the melting point but above the crystallization point. Then the irradiated spot is cooled gradually and assumes a crystalline state.

A recorded pattern having crystalline and amorphous spots as mentioned above, which corresponds to the modulated data signal 105, is created in the data area 604 on the guide groove 2302. Thus, writing and reading of information are performed using a difference of reflectivity between the crystalline and amorphous states.

As shown in (d) of FIG. 29, there is a gap area 602 between the ID area 601 and the VFO area 603, as well as a buffer area 606 between the dummy data area 605 and the next ID area 601. The gap area 602 generates a time for controlling the laser power, and the buffer area 606 compensates for a difference of recording position due to rotation variability of the spindle motor.

When scanning an ID area 601 between sectors 607 of the optical disk, address data are read by the laser irradiating the optical disk with the same weak power as the reading power.

The system controller circuit has a configuration shown in FIG. 30. Transmission of write data and read data between a host computer and the write/read apparatus is performed using a write data buffer 2601 and read data buffer 2602 respectively. The read data is given to the read data buffer 2602 as well as an address data detector circuit 2603. An address data detecting signal is transmitted to the write data buffer 2601 and the read data buffer 2602. A motor driver circuit 2604 drives the spindle motor.

When writing on the optical disk repeatedly as mentioned above, a quality of the read signal of the written data in a sector may be deteriorated at a certain part. Especially, writing similar data into the same sector repeatedly makes the deterioration serious because that part of the sector undergoes repeated melting and hardening while another part never melts. As a result, the thickness of the recording film changes at the boundary of the two parts, so that the thermal and optical characteristics are deteriorated at the boundary. In this case, it is difficult to record (write) and reproduce (read) data properly.

There is a writing method to solve the above-mentioned problem proposed in the Japanese laid-open patent application (Tokukaihei) 2-94113. This method writes data while varying the start point for writing a sector at random within a predetermined range. This range is called the variation range in this specification.

In this writing method, however, the variation range of the start point for writing was constant for various recording media or conditions. On the other hand, the deterioration rate of the recording film depends not only on the number of repeating writings but also on the recording medium or recording condition.

Therefore, the above-mentioned writing method in the prior art is not enough for improving the deterioration of the recording film in every case. For example, when overwriting the optical disk, the whole sector is overwritten. Therefore, even if the data to be written are only a small part of the sector, the whole sector is overwritten actually. A directory area of the disk is overwritten repeatedly with similar data. Thus, the directory area has a tendency to have its recording film deteriorated earlier than another area (called the general area in this specification).

Increasing the variation range of the start point for writing may reduce the deterioration of the recording film. However, an area for writing VFO or dummy data is decreased in a sector because the data area should be settled in the sector. In other words, when adding the VFO area for generating synchronizing data to the head of the data area, and adding the dummy data area to the tail of the data area, the length of the VFO area or the dummy data area have to be shortened in accordance with the enlarged variation range of the start point for writing. Therefore, the deterioration of the recording film at the start and end points of the sector may become critical when being written repeatedly, so that reading of the written data becomes difficult at a certain deterioration level of the recording film. As a result, the number of overwriting of the optical disk may be lowered.

SUMMARY OF THE INVENTION

The present invention provides a method and apparatus for writing on and reading an optical recording medium, which can relieve a deterioration of the recording film properly and increase the number of overwritings by changing the variation range of the start point for writing in accordance with the writing condition.

A method according to the present invention comprises the steps of converting write data into a modulated data signal corresponding to a record pattern on the recording medium, selecting a first or second write timing, altering the start point for writing the modulated data signal at random within a first variation range in a sector if the first write timing is selected, and altering the start point for writing the modulated data signal at random within a second variation range that is larger than the first variation range in a sector if the second write timing is selected.

As mentioned above, the variation range of the start point for writing is set in accordance with a recording medium or recording conditions. Thus, deterioration at the specific part of the recording film is relieved when writing repeatedly, and the number of overwritings is increased by enlarging the variation range in the case of a critical recording method or medium. On the other hand, the number of overwritings can be increased by lengthening the VFO area or the dummy data area for suppressing the deterioration at the head or tail part of the sector in the case of the recording method or medium that generates little deterioration of the recording film due to repeated writing. The information of the recording condition or medium can be prerecorded in the medium as an identifier. Alternatively, the variation range can be altered in accordance with the modulation method of the write data or the recording condition such as overwriting frequency of the sector, whether the sector is directory area or not, or whether the sector is on the guide groom or on the land (between the guide grooves).

A second method according to the present invention comprises the following steps for recording and reproducing. The writing steps comprise selecting one of two or more different methods for converting write data into converted data, writing an identifier for identifying the method used as the converting method, together with the converted data into an optical recording medium. The reproducing steps comprise reading the converted data and the identifier from the optical recording medium, and selecting one of two or more methods for restoring the original data from the read data in accordance with the identifier. According to this method, the write data signals have different patterns by changing an order of blocks even if the same write data are written into the same part of the optical recording medium repeatedly. As a result, a damage at a specific part of the recording film can be dispersed, and a deterioration of the recording film due to repeated overwriting can be reduced.

DETAILED DESCRIPTION OF THE PREFERRED EMBODIMENTS

The writing and reading method and apparatus according to the present invention are further explained in detail using the figures and preferred embodiments.

First Embodiment

Figure 1:
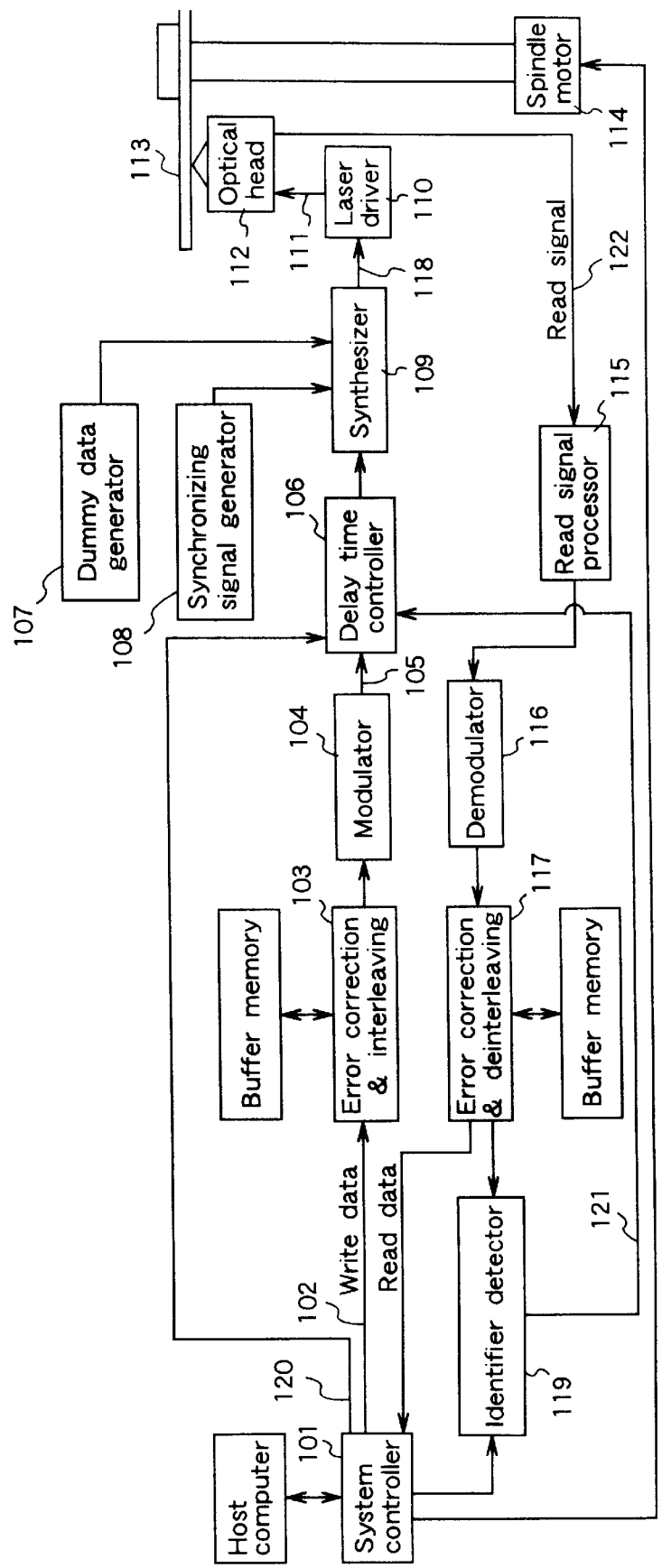
FIG. 1 is a block diagram of a writing and reading apparatus according to a first embodiment of the present invention.
Figure 2:
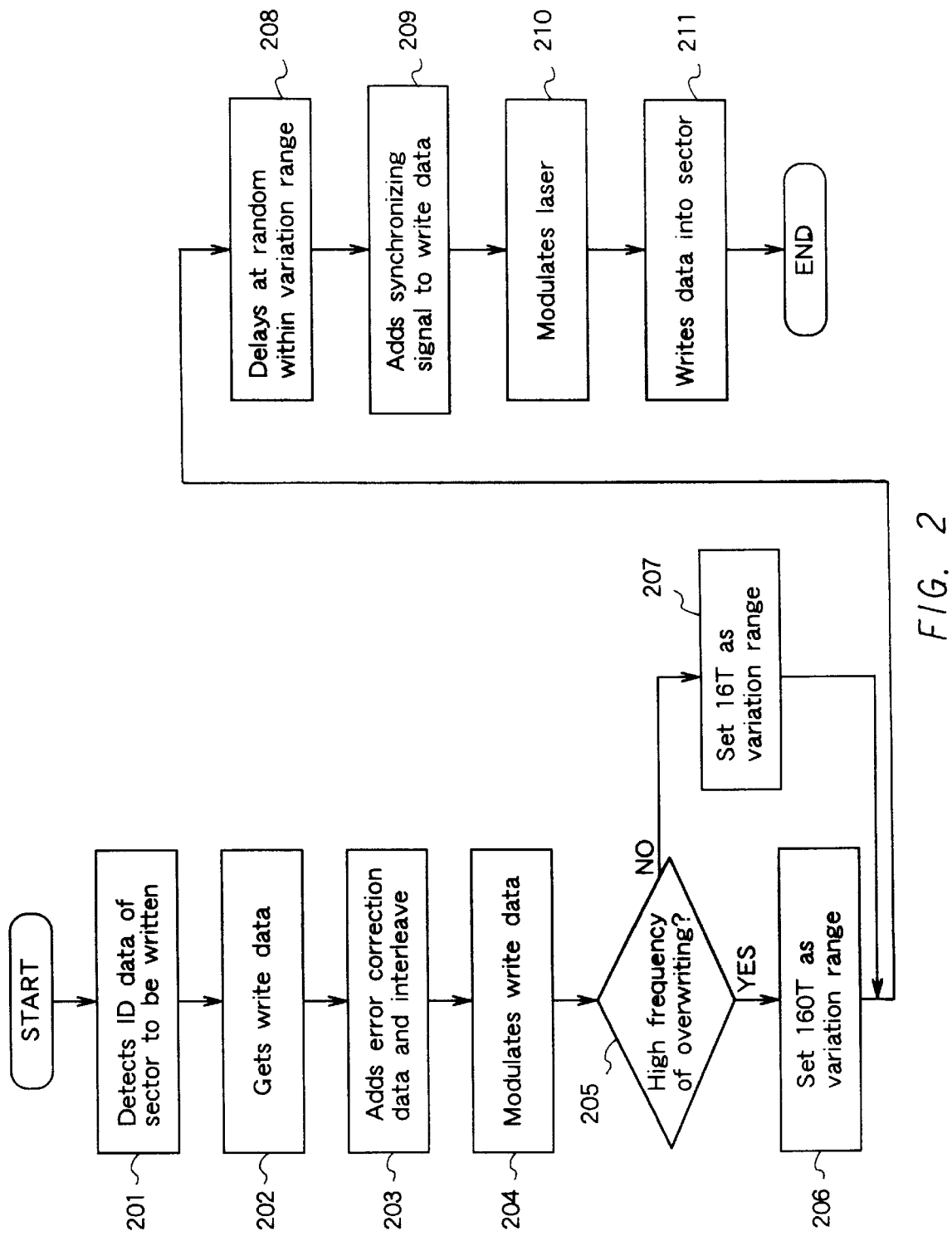
FIG. 2 is a flow chart showing a process for overwriting a sector of the optical disk in the apparatus shown in FIG. 1.

FIG. 1 shows a block diagram of an apparatus for writing on and reading an optical recording disk according to a first embodiment of the present invention. FIG. 2 shows a flow chart for overwriting a sector of the optical disk in the apparatus shown in FIG. 1. A system controller circuit 101 that is connected to a host computer detects an address data of a sector to be overwritten in the optical disk 113 (Step 201 in FIG. 2). Then the system controller circuit 101 outputs write data 102 (Step 202).

Figure 28:
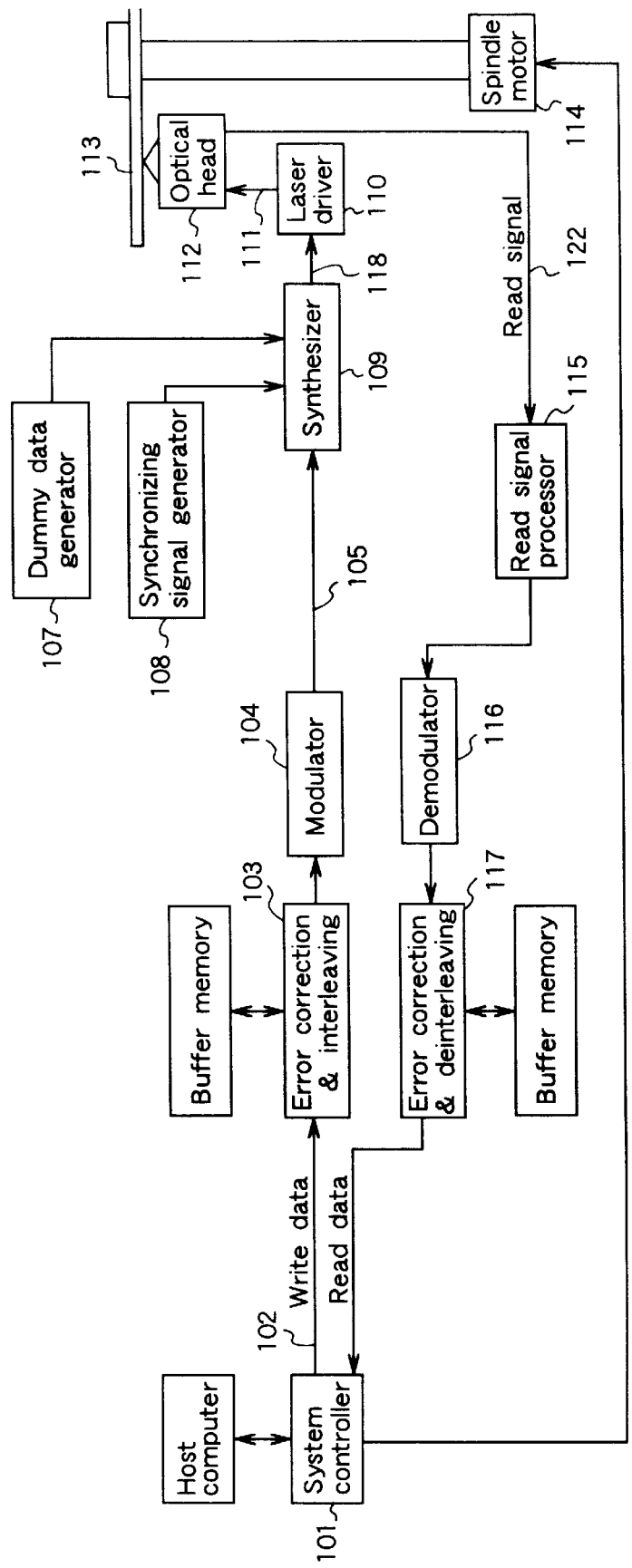
FIG. 28 is a block diagram of a writing and reading apparatus in the prior art.

An error correction and interleaving circuit 103 adds error correction data to the write data, and performs an interleaving process (Step 203). The interleaved data is then modulated by a modulator circuit 104 (Step 204). These operations are the same as the prior art shown in FIG. 28.

Figure 29:
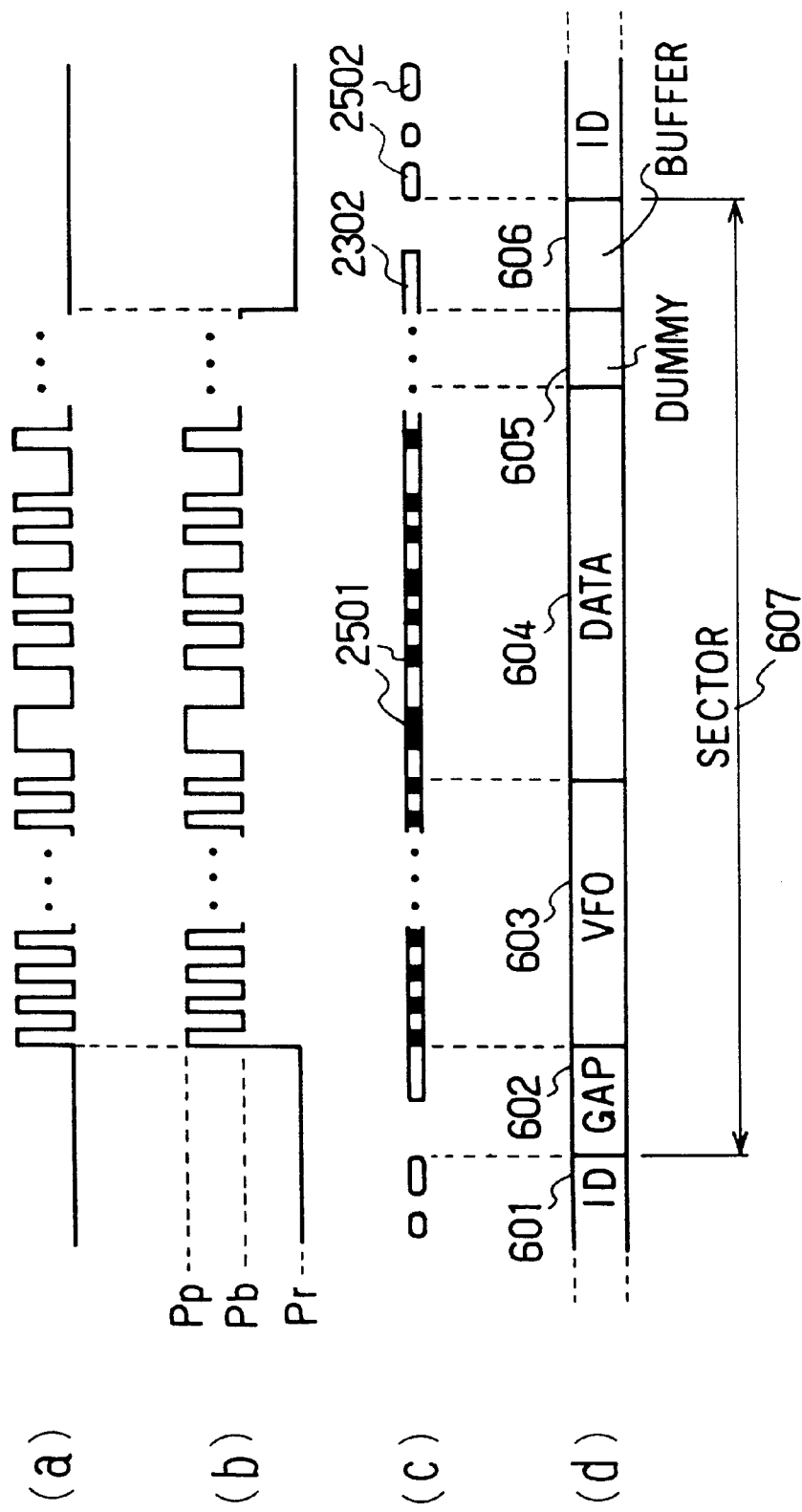
FIG. 29 (including subparts a–d) shows write data, modulated laser power, record mark and record format in the prior art.

The modulator circuit 104 outputs the modulated signal 105, which is supplied to a delay time controller circuit 106. The delay time controller circuit 106 judges whether the area to be overwritten has a high frequency of overwriting, such as the directory area or not (Step 205), and sets the variation range of the start point for writing to be large in an area like the directory area (Step 206), or small in a general area (Step 207). The above-mentioned judgment is performed according to the identifier detected by an identifier detector circuit 119. This identifier is prewritten in the ID area 601 (FIG. 29) or other area of each sector. The identifier detector circuit 119 detects the identifier according to a predetermined timing generated by the system controller circuit 101. The timing corresponds to the position of the written identifier in the optical disk 113, and outputs the detected result signal.

The delay time controller circuit 106 delays the modulated data 105 at random within a predetermined delay time corresponding to the variation range set for the modulated data 105 (Step 208). The delay time controller circuit will be explained in detail later.

A synthesizer circuit 109 adds a synchronizing signal (VFO) generated by a synchronizing signal generator circuit 107 and dummy data generated by a dummy data generator circuit 108 to each data block to be written into a sector, so as to generate a write data signal 118 (Step 209). The write data signal 118 is supplied to a laser driver circuit 110, which generates a laser driving signal 111 to drive a laser housed in an optical head 112. After the intensity of the laser beam is modulated (Step 210), the laser beam irradiates the optical disk 133 for writing data into the sector.

Figure 3:
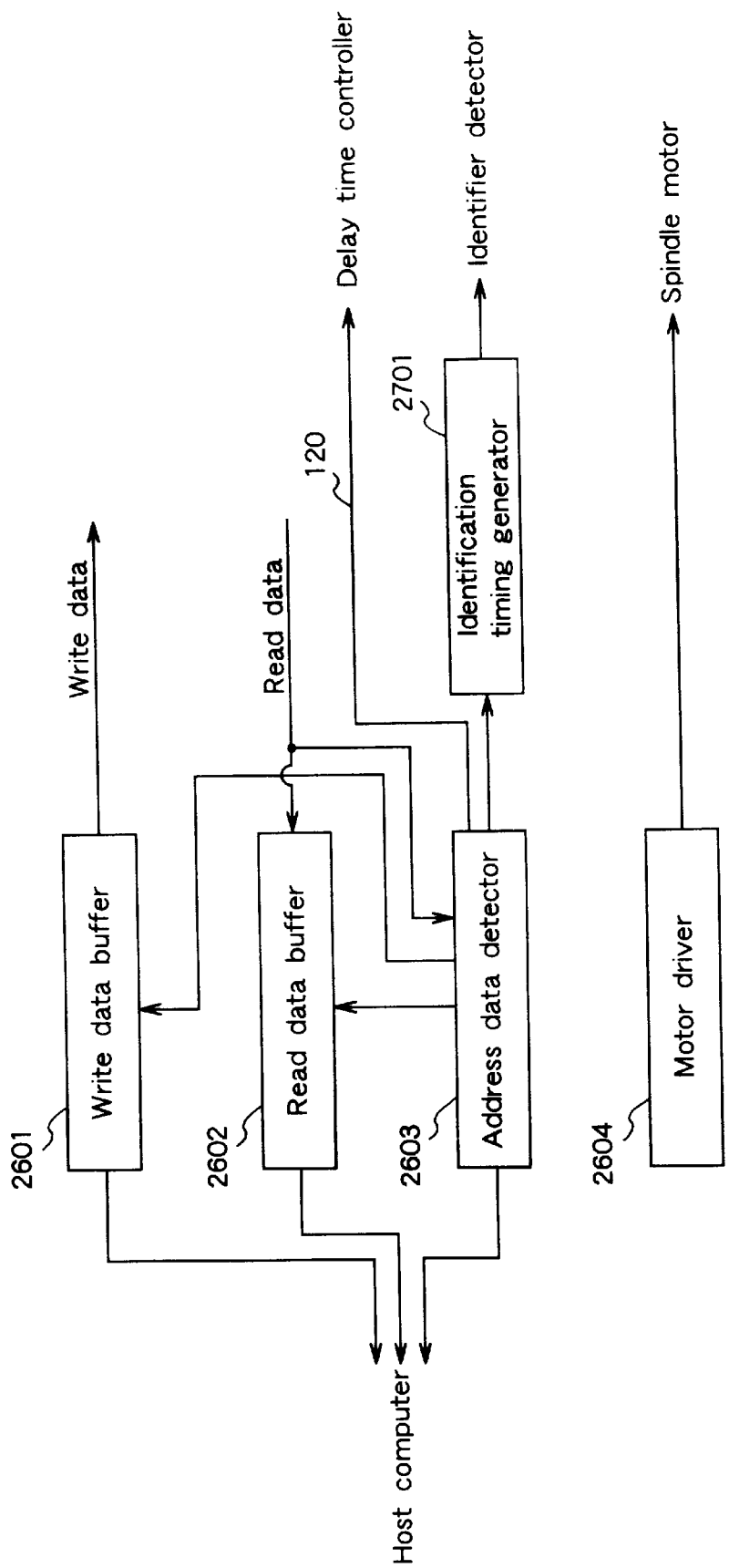
FIG. 3 is a block diagram of a system controller circuit of the apparatus shown in FIG. 1.
Figure 30:
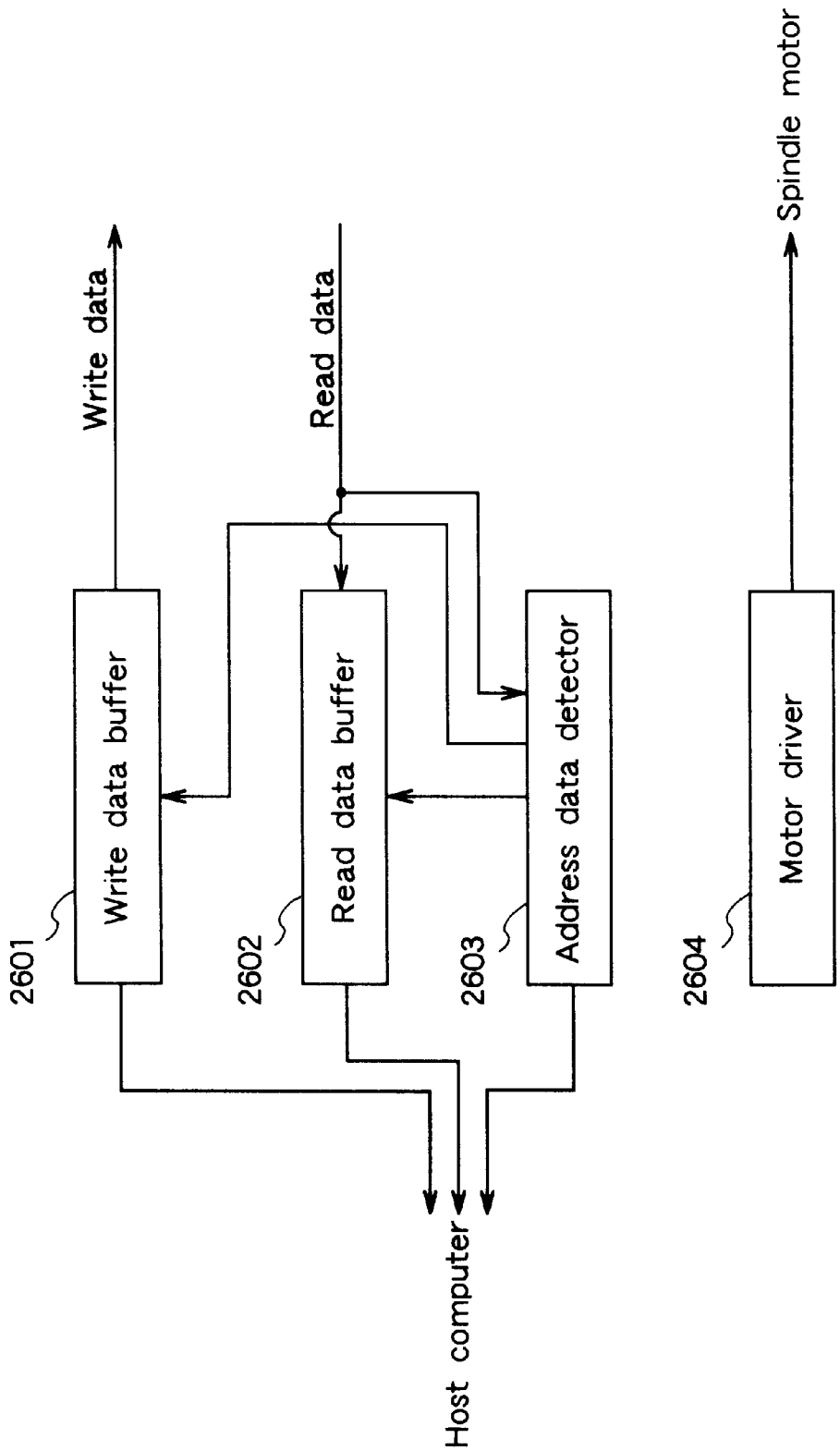
FIG. 30 is a block diagram of a system controller circuit of the apparatus shown in FIG. 28.

The system controller circuit has a configuration as shown in FIG. 3. This configuration differs from that of the prior art shown in FIG. 30 in that an identification timing generator circuit 2701 supplies an identification timing signal to the identifier detector circuit 119 according to an address data and an address detection signal from an address data detector circuit 2603. The address data. detecting signal is also supplied to the delay time controller circuit 106.

Figure 4:
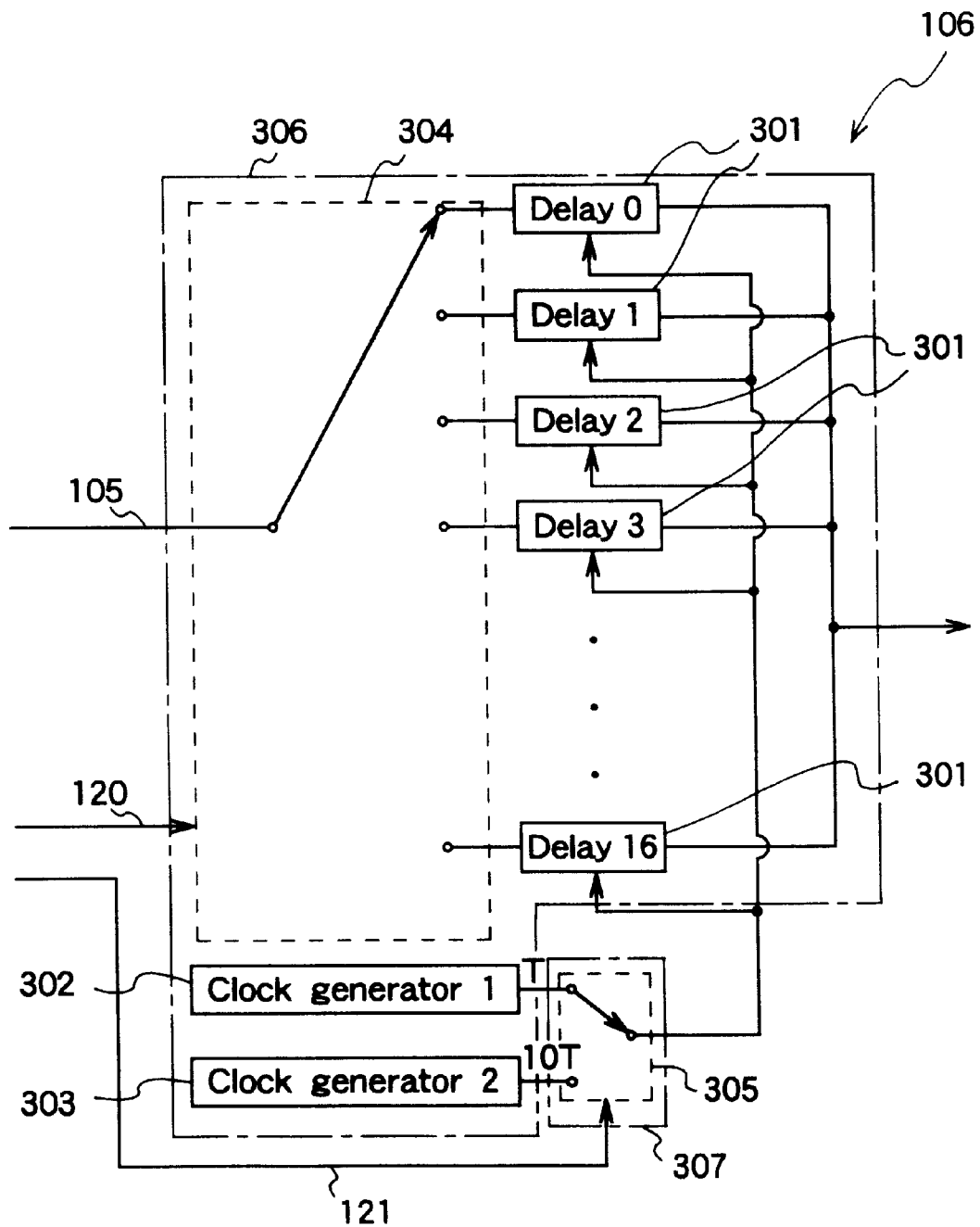
FIG. 4 shows an example of a delay time controller circuit of the apparatus shown in FIG. 1.

FIG. 4 shows an example of the delay time controller circuit 106. Generally, a delay time controller circuit includes a write control section having two different write timings, and a selecting section for selecting one of the two write timings in accordance with the identifier. In FIG. 4, the selecting section is a switching circuit 305. The write control section includes plural delay circuits 301, two clock generators 302, 303 that generate clock signals for the delay circuits 301, and selector 304 that selects one of the delay circuits 301 for inputting the modulated data signal 105. Each delay circuit 301 includes shift registers, delay lines or counters.

The delay time controller circuit shown in FIG. 4 has two clock generator circuits 302, 303. The period of the clock generated by the first clock generator circuit 302 is T, and that generated by the second clock generator circuit 303 is 10T.

If the switching circuit 305 selects the first clock generator circuit 302, the delay times of the delay circuits are 0, T, 2T, 3T, . . . . , 16T respectively (First write timing). On the contrary, if the second clock generator circuit 303 is selected, the delay times of the delay circuits 301 are 0, 10T, 20T, 30T, . . . . , 160T respectively (Second write timing).

The actual operation of the delay time controller circuit 106 shown in FIG. 4 is as follows.

When writing on the general area of the optical disk 113, the switching circuit 305 selects the first clock generator circuit 302 according to the signal 121 from the identifier detector circuit 119. The delay circuits 301 generate corresponding delay times 0–16T based on the period T of the first clock. The address detection signal 120 makes the selector 304 select one of delay circuits 301 at random. The selected delay circuit is maintained until the next address is detected.

When writing on the directory area of the optical disk 113, the switching circuit 305 selects the second clock generator circuit 303 according to the signal 121 from the identifier detector circuit 119. The delay circuits 301 generate corresponding delay times 0–160T based on the period 10T of the second clock. The address detection signal 120 makes the selector 304 select one of delay circuits 301 at random. Thus, the variation range of the start point, for writing data can be altered between the directory area and other area by changing the clock (period step) for the plural delay times.

Figure 5:
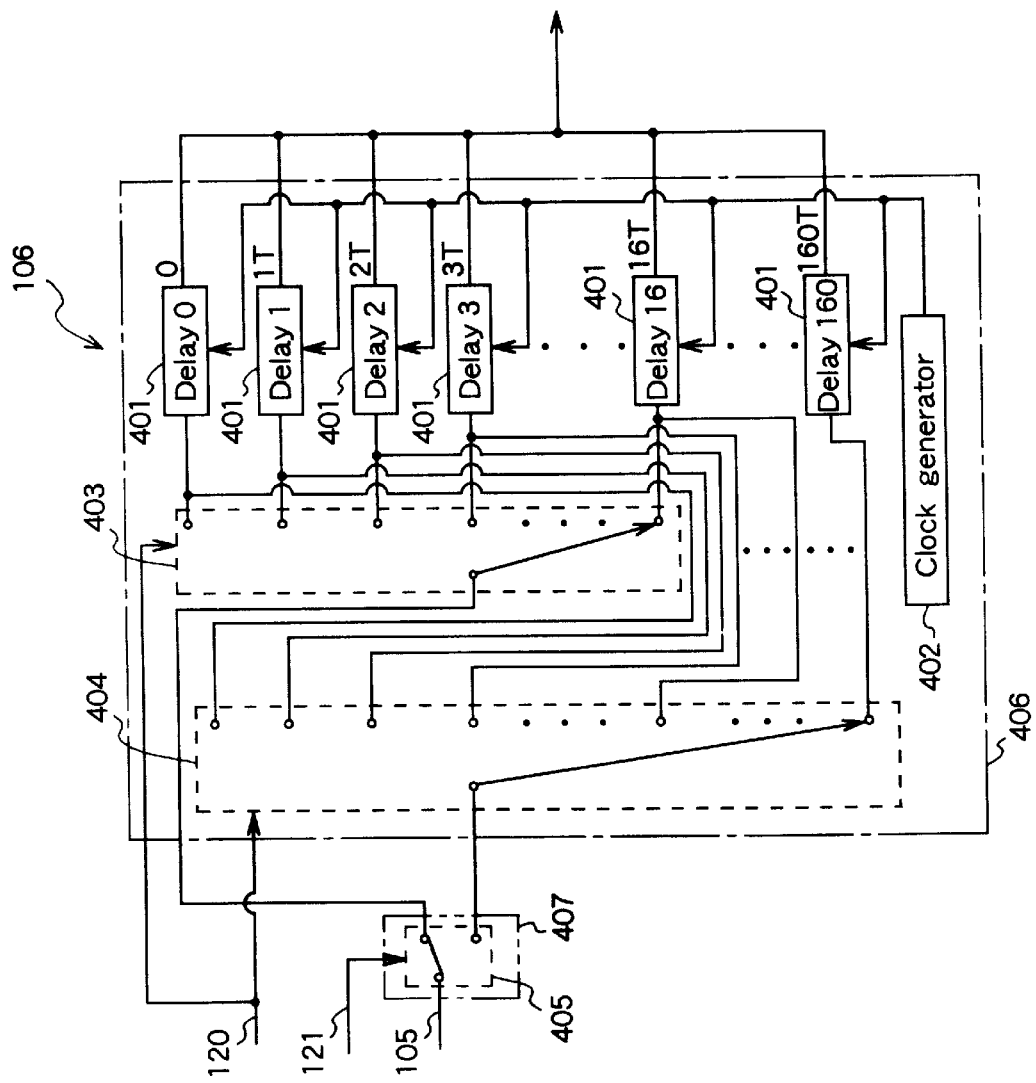
FIG. 5 shows another example of a delay time controller circuit of the apparatus shown in FIG. 1.

FIG. 5 shows another example of the delay time controller circuit 106. In this circuit, the selecting section is a switching circuit 405. The write control section includes plural delay circuits 401, a clock generator circuit 402 that generates a clock signal for the delay circuits 401, and two selectors 403, 404 that select one of the delay circuits 401 for inputting the modulated data signal 105 through the switching circuit 405.

The delay times of the delay circuits 401 are 0, T, 2T, 3T, . . . , 160T based on the clock period T. In other words, the step width is T, and the total width is 160T.

The delay time controller circuit shown in FIG. 5 has two selectors 403, 404. If the switching circuit 405 selects the first selector 403, the write timing is altered at random within the delay time of 0–16T (First write timing). If the switching circuit 405 selects the second selector 404, the write timing is altered at random within the delay time of 0–160T (Second write timing).

The actual operation of the delay time controller circuit 106 shown in FIG. 5 is as follows.

When writing on the general area of the optical disk 113, the switching circuit 405 selects the first selector 403 according to the signal 121 from the identifier detector circuit 119. The delay time is selected at random from 16 steps 0–16T. The selected delay time is maintained until the next address is detected.

When writing on the directory area of the optical disk 113, the switching circuit 405 selects the second selector 404 according to the signal 121 from the overwrite frequency identifier detector circuit 119. The delay time is selected at random from 160 steps 0–160T. The selected delay time is maintained till detection of the next address. Thus, the variation range of the start point for writing can be changed between the directory area and other areas by changing the step number of the plural delay times.

The following explanation is about an example for confirming the effect of this embodiment. The substrate of the optical disk 113 was made of a polycarbonate plate having a diameter of 130 mm and a thickness of 0.6 mm. Pits are preformed on the substrate as address data, and guide grooves on which data are to be written are formed in sector areas. A pitch of the guide grooves was 1.6 micron. Four layers, that is a protective film, a photosensitive film, a protective film and a reflection film were formed on the substrate by sputtering. Then, a protective sheet was glued on the surface of the layers. The protective film was made of $ZnS-SiO_2$, the photosensitive film was made of Te-Sb-Ge, and the reflection film was made of Al.

The above-mentioned optical disk was rotated at a linear speed of 5 m/s by a spindle motor 113. A laser beam having a wavelength of 680 nm was used for writing after being focused by an objective lens with a numerical aperture (N. A.) of 0.6.

Laser powers for writing and reading were set at Pp=10 mW, Pb=4 mW, and Pr=1 mW. A method of (8–16) pulse width modulation was used for modulating the write data. The shortest mark length was 0.6 micron. The delay time controller circuit 106 was used, which selects the variation range of the start point for writing by selecting the clock generator circuit 302 or 303 as shown in FIG. 4.

Under the above-mentioned conditions, the relationship between the variation range of the start point for writing and an error rate of read data is measured in each area. In the directory area, assuming similar data are to be written repeatedly in a real application, two patterns of data were written repeatedly and the variation range was set within 0–160T (0–10T per a step). In the general area, thirty patterns of data were written repeatedly and the variation range was set within 0–64T (0–4T per a step). The error rate of the read data was measured after overwriting 100,000 times.

Figure 6A:
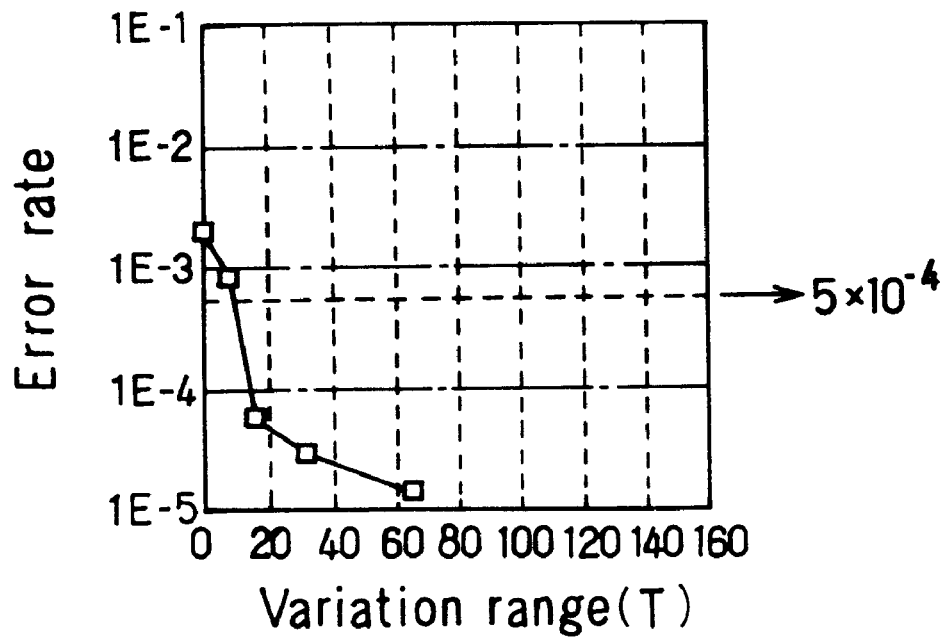
FIG. 6A is a graph showing the relationship between a variation range of the start point for writing in a general area and an error rate.
Figure 6B:
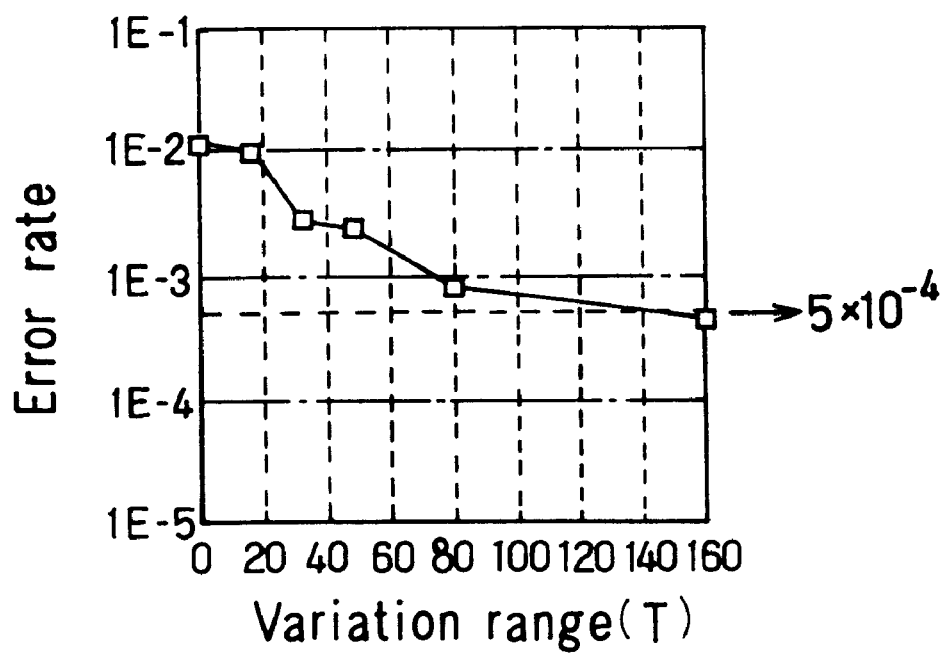
FIG. 6B is a graph showing the relationship between a variation range of the start point for writing in a directory area and an error rate.

FIG. 6A shows the relationship between the variation range of the start point for writing and the error rate after overwriting 100,000 times in the general area. FIG. 6B shows the relationship between the variation range of the start point for writing and the error rate after overwriting 100,000 times in the directory area.

As understood from FIGS. 6A and 6B, a better error rate after overwriting 100,000 times is obtained if the variation range of the start point for writing becomes larger. It was also understood that the minimum variation range of the start point for writing in which the good error rate was obtained varied depending on the type of area (this means a randomness of the write data).

In accordance with the above-mentioned result, the variation range of the start point for writing was set as follows. To obtain the error rate below 0.0005, the variation range of the start point for writing was set at 16T (1T per a step) in the general area, and at 160T (10T per a step) in the directory area (variable variation range case). For comparison, first and second fixed variation range cases were also performed. In the first fixed variation range case, the variation range was set at 16T (1T per a step) in both the general and directory areas. In the second fixed variation range case, the variation range was set at 160T (10T per a step) in both the general and directory areas.

Figure 7:
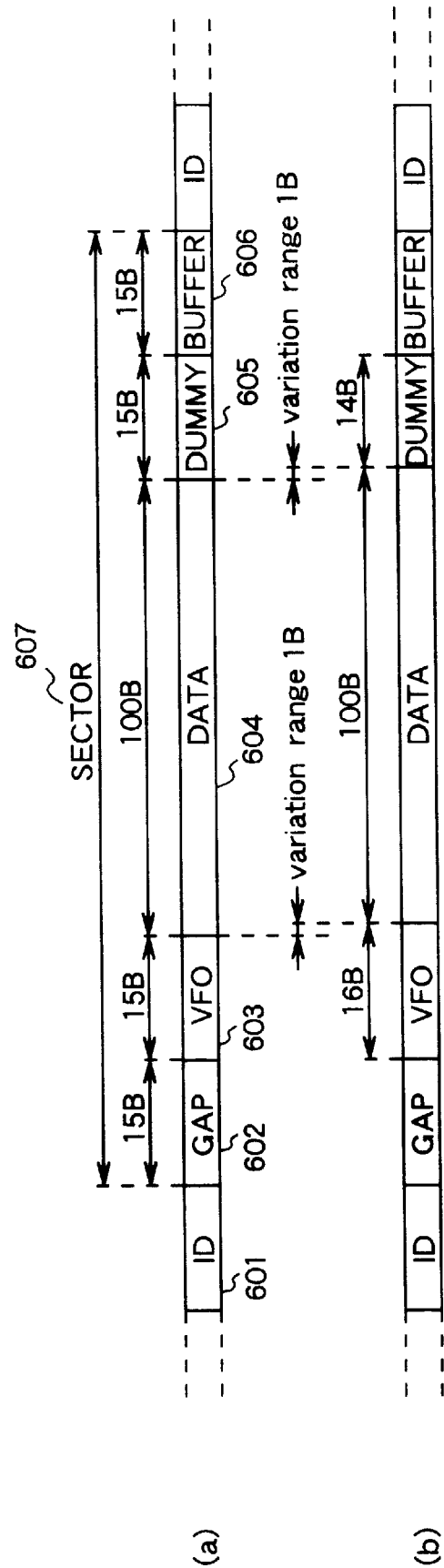
FIG. 7 (including subparts a–b) shows a record format when the variation range of the start point for writing was set at 16T in the apparatus shown in FIG. 1.

FIG. 7 shows a record format when the variation range of the start point for writing was set at 16T. A clock for writing data was the same as the clock for generating delay times. A data volume that can be written in a sector was 1000 bytes. Data lengths of the VFO area and dummy data area were both 15 bytes when the start point for writing didn't change.

In FIG. 7, (a) shows a record format in the case where the start point for writing didn't change. A data area 604 was provided with VFO 603 and dummy data 605 after being provided with a delay time by the delay time controller circuit 106, and then supplied to the laser driver circuit 110 for generating the laser driving signal 111.

In FIG. 7, (b) shows a record format in the case where the start point for writing was shifted backward by 16T (i.e., 1 byte). In this case, the laser-driving signal 111 was generated 16T later than the case of (a). In the writing process with the variation range of 16T, the generation timing of the laser driving signal corresponding to the data area varied within 16T by means of the delay time controller circuit. As a result, the data written position in the sector varied within 16T (1 byte).

Figure 8:
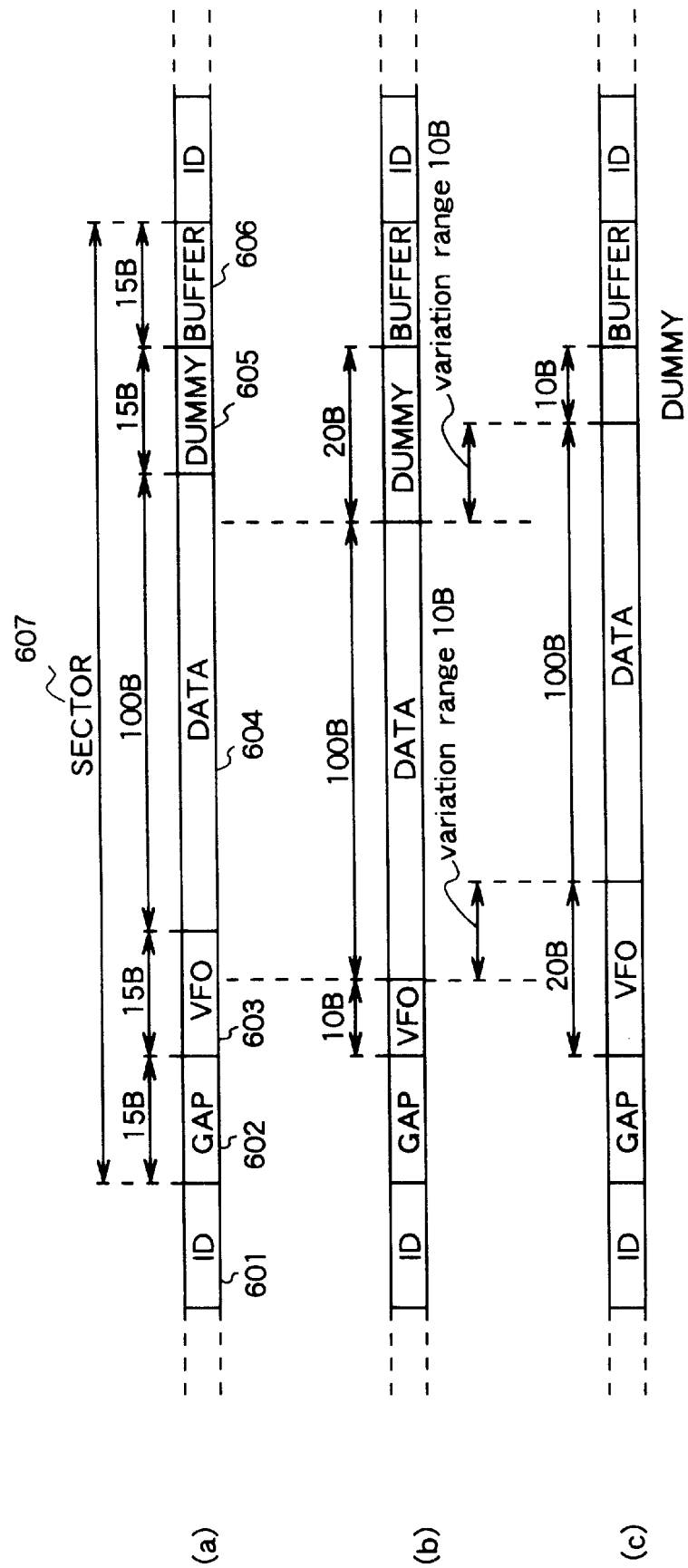
FIG. 8 (including subparts a–c) shows a record format when the variation range of the start point for writing was set at 160T in the apparatus shown in FIG. 1.

FIG. 8 shows a record format when the variation range of the start point for writing was set at 160T. In FIG. 8, (a) is a record format in the case where the start point for writing didn't change, (b) is in the case where the start point for writing was shifted forward by 80T (i.e., 5 byte), and (c) is in the case where the start point for writing was shifted backward by 80T (i.e., 5 byte). In the case (b), the laser-driving signal 111 corresponding to the data area was generated 80T earlier than the case (a). In the case (c), the laser-driving signal 111 corresponding to the data area was generated 80T later than the case (a).

In the writing process with the variation range of 160T, the generation timing of the laser-driving signal varied within 160T by means of the delay time controller circuit. As a result, the data written position in the sector varied within 160T (10 byte). The ID area in the optical disk predetermines the length of the sector. Therefore, if the gap area 802 and the buffer area 806 have fixed lengths, the VFO and dummy data areas can decrease in their lengths as the written position varies more widely in the sector.

In the first fixed variation range case mentioned above, the variation range was 1 byte in both the directory area and other areas. Therefore, the length of the VFO area or dummy data area varied within 15–16 bytes or 14–15 bytes. In other words, the shortest length of the VFO area or the dummy data area was 14 or 15 bytes. Similarly, in the second fixed variation range case, the variation range was 10 bytes in both the directory area and other areas. Therefore, the length of the VFO area or dummy data area varied within 10–20 bytes, and the shortest length of the VFO area or the dummy data area was 10 bytes.

On the other hand, in the variable variation range case mentioned above, in the directory area, the variation range of the start point for writing was 10 bytes, so the lengths of the VFO area and the dummy data area varied within 10–20 bytes as shown in FIG. 8. The shortest length of the VFO area or the dummy data area was 10 bytes. In the general area, the variation range of the start point for writing was 1 byte, so the length of the VFO area or the dummy data area varies within 15–16 bytes (or 14–15 bytes). The shortest length of the VFO area or the dummy data area was 14 or 15 bytes.

Under the above-mentioned conditions, the following experiment was performed. Two patterns of data were written into the directory area repeatedly, and thirty patterns of data were written into the general area repeatedly. Error states were investigated after overwriting 50,000 times and 100,000 times.

Table 1 shows the comparison of the error state among the first fixed variation range case, the second fixed variation range case and the variable variation range case. In this table, "synchro error" means a synchronizing error state making the data reproduction impossible when a phase-locked loop (PLL) circuit becomes out of lock. Similarly, "read error" means a state of improper error correction making the data reproduction impossible.

TABLE 1

|  | Variation range | After 50,000 | After 100,000 |
| --- | --- | --- | --- |
| First fixed v.r. case |  |  |  |
| General area | 16T | OK | OK |
| Directory area | 160T | read error | read error |
| Second fixed v.r. case |  |  |  |
| General area | 160T | OK | synchro error |
| Directory area | 160T | OK | synchro error |
| Variable v.r. case |  |  |  |
| General area | 16T | OK | OK |
| Directory area | 160T | OK | synchro error |

As shown in Table 1, in the first fixed variation range case, the general area could be overwritten 100,000 times with no error, but the directory area had a read error after 50,000 times of overwriting. A waveform distortion was observed in the read signal of the directory area. It is estimated that the read error was generated because the variation range of the start point was too small for the write data with small randomness, so a local deterioration of the recording film was generated.

In the second fixed variation range case, both the general and directory areas could be overwritten 50,000 times with no error, but had a synchronizing error after 100,000 times of overwriting. In the waveform of the read signal after 100,000 times of overwriting, at least 5 bytes of the VFO were missing. It is estimated that the synchronizing error was generated when the length of the VFO area became short since the variation range of the start point was large, and the deterioration of the recording film at the start point in the sector caused an unlock of the PLL circuit since the deteriorated portion in the VFO area became relatively large.

On the other hand, in the variable variation range case, both the general and directory areas could be overwritten 50,000 times with no error, and the general area could be overwritten 100,000 times with no error. The reason why the general area could be overwritten 100,000 times with no error may be that the deteriorated portion in the VFO area became relatively small by decreasing the variation range of the start point for writing, and increasing the length of the VFO area in the general area. In addition, since the variation range of the start point for writing was set large in the directory area, a local deterioration of the recording film was hardly generated in the data area. Thus, the directory area could be overwritten 50,000 times without error.

As explained above, this embodiment of the present invention provides a better method for writing and reading an optical recording medium, in which the variation range of the start point for writing can be changed in accordance with a write condition. Therefore, a local deterioration of the recording film due to repeated overwriting can be reduced by enlarging the variation range in the directory area that has a tendency to have its recording film deteriorated early due to repeated overwriting. Thus, the number of times of overwriting can be increased. In addition, in the general area where the deterioration of the recording film is little, the number of times of overwriting in the general area can be further increased by lengthening the VFO and/or dummy data area for relieving a deterioration at the start and end points in the sector.

Figure 9:
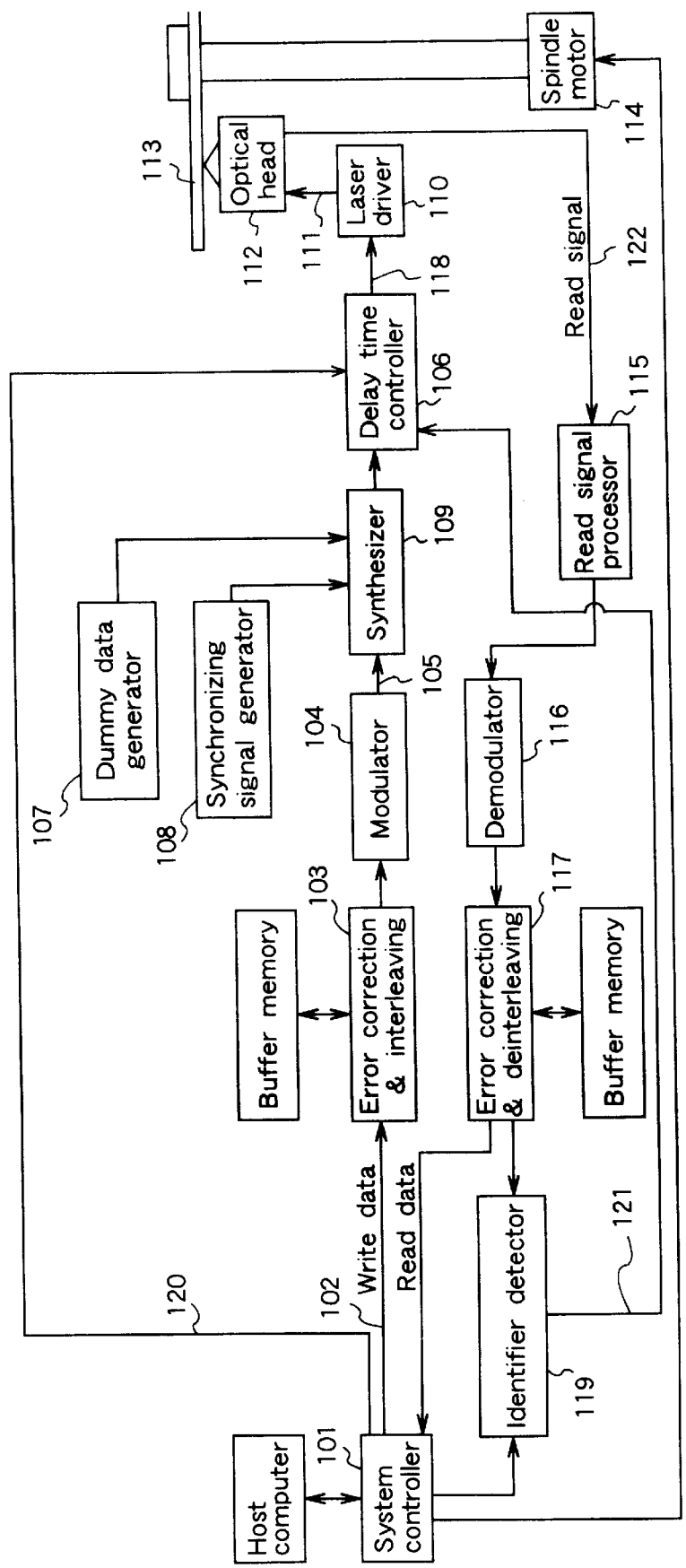
FIG. 9 is a block diagram of a variation of the writing and reading apparatus shown in FIG. 1.
Figure 10:
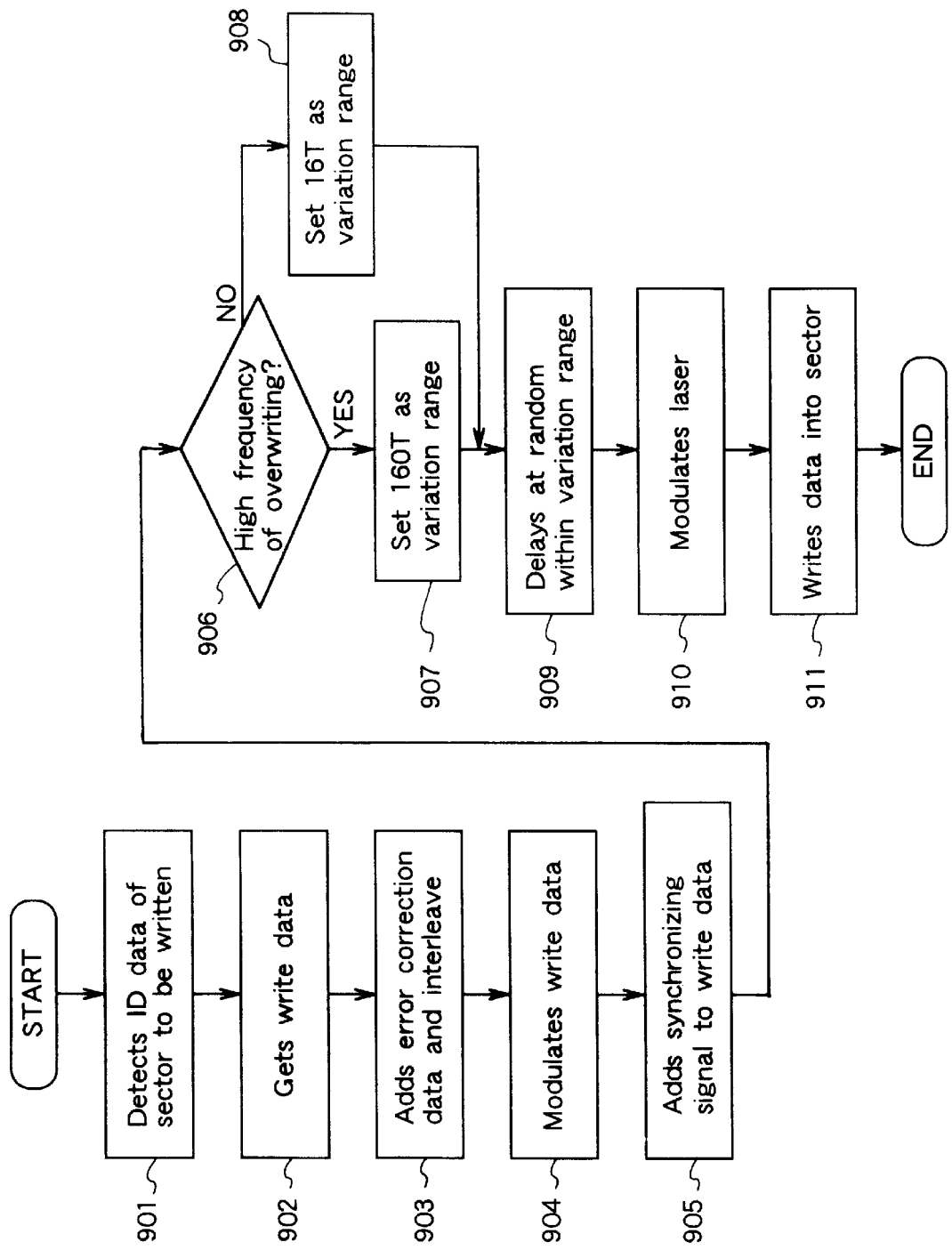
FIG. 10 is a flow chart showing a process for overwriting a sector of the optical disk in the apparatus shown in FIG. 9.

In FIG. 1, the delay time controller circuit 106 is located before the synthesizer circuit 109. Alternatively, the delay time controller circuit 106 may be located after the synthesizer circuit 109 as shown in FIG. 9. In this case, FIG. 10 shows a flow chart for overwriting a sector of the optical disk. This flow chart differs from that shown in FIG. 2 in that the write data is delayed (Step 909) by the delay time controller circuit 106 after being provided with the VFO 603 and dummy data 605 (Step 905).

Figure 11:
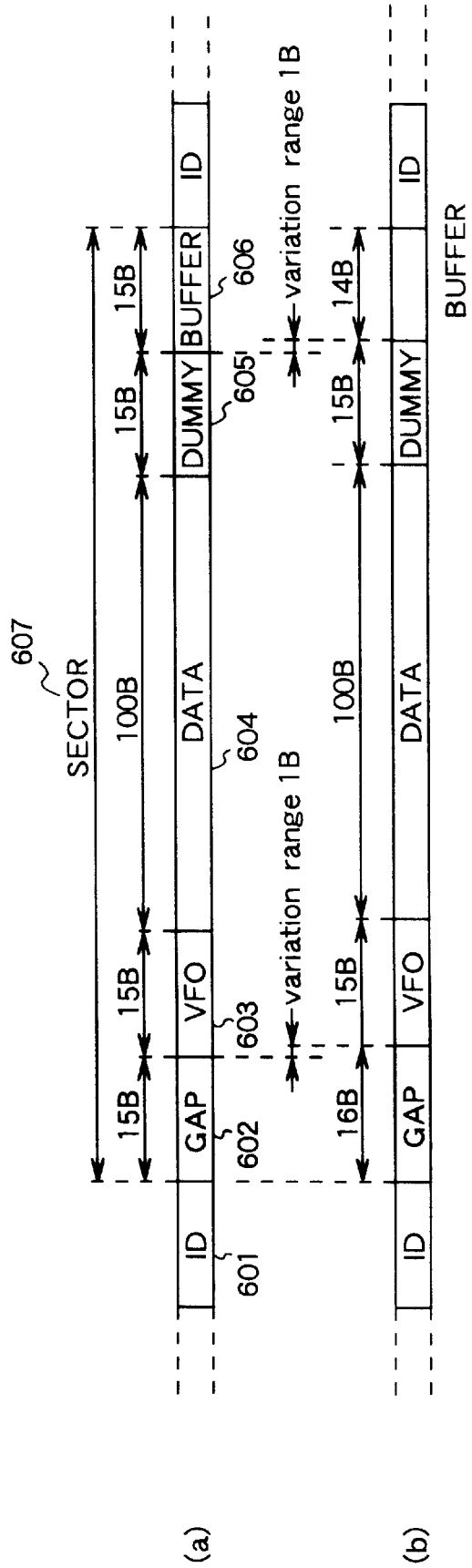
FIG. 11 (including subparts a–b) shows a record format when the variation range of the start point for writing was set at 16T in the apparatus shown in FIG. 9.

FIG. 11 shows a record format when the variation range of the start point for writing was set at 16T. In FIG. 11, (a) shows a record format in the case where the start point for writing didn't alter, and (b) shows a record format in the case where the start point for writing was delayed 16T (i.e., 1 byte).

Figure 12:
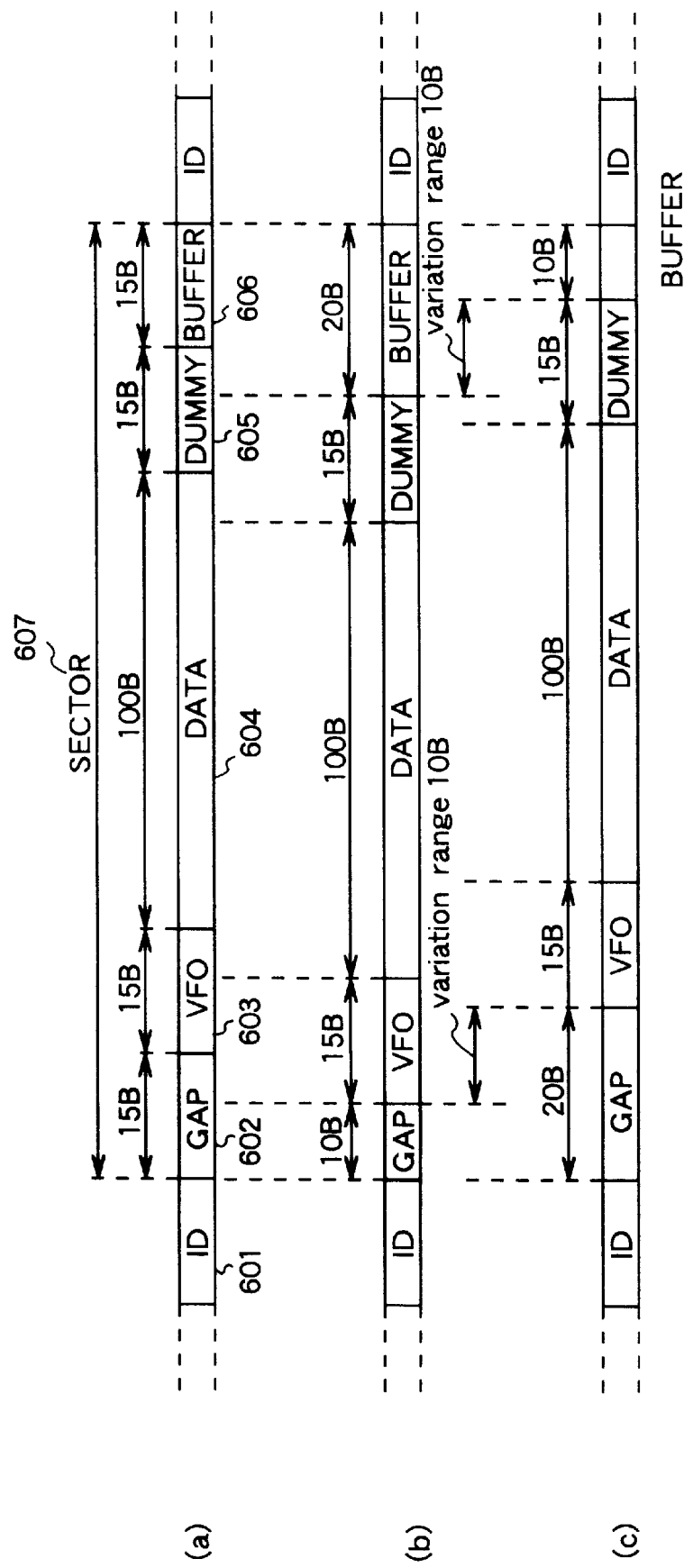
FIG. 12 (including subparts a–c) shows a record format when the variation range of the start point for writing was set at 160T in the apparatus shown in FIG. 9.

FIG. 12 shows a record format when the variation range of the start point for writing was set at 160T. In FIG. 12, (a) is a record format in the case where the start point for writing didn't alter, (b) is in the case where the start point for writing was shifted forward by 80T, and (c) is in the case where the start point for writing was delayed 80T.

These cases differ from the cases shown in FIG. 7 and 8 in that all the start points for writing the VFO 603, the data area 604 and the dummy data 605 were varied. As a result, an influence of the deterioration at the start and/or end point of the sector is reduced, since the lengths of the VFO and dummy data areas were not shortened.

Figure 31:
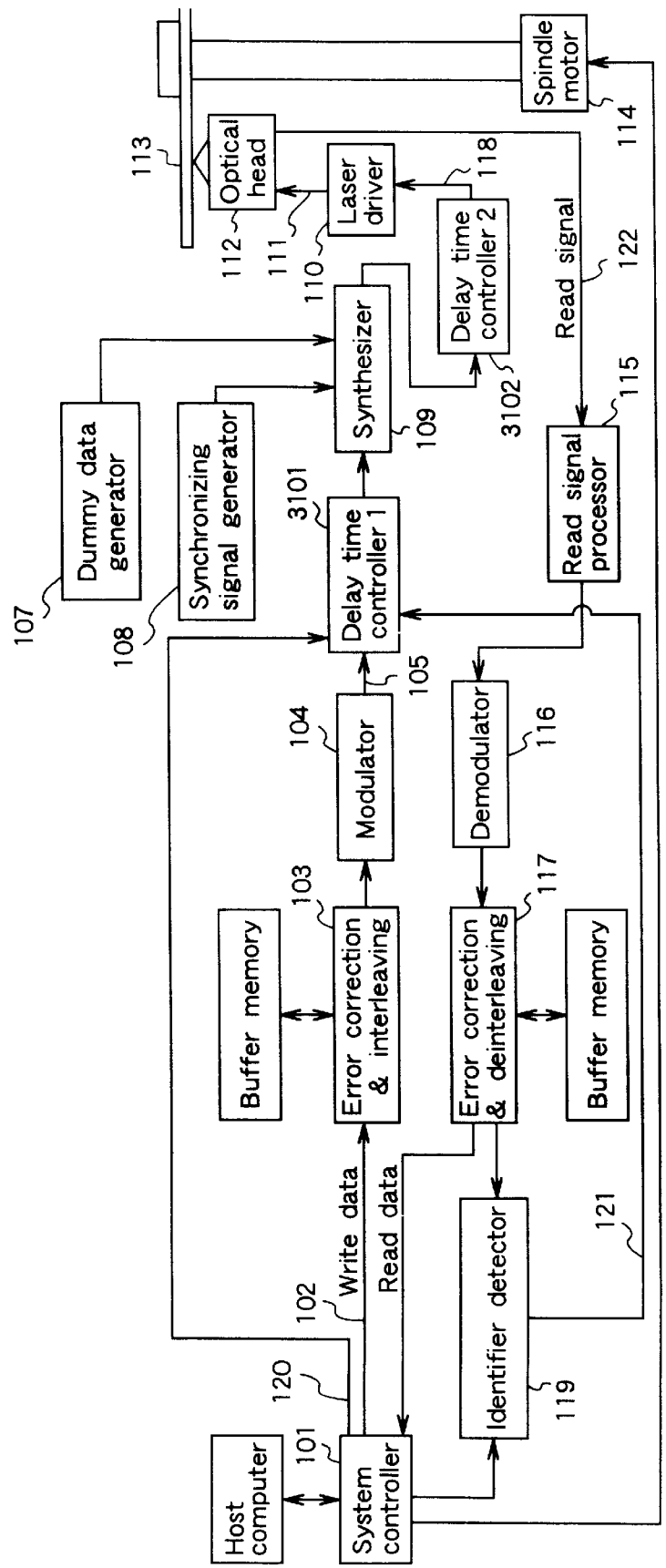
FIG. 31 is a block diagram of a variation of the apparatus shown in FIG. 1.
Figure 32:
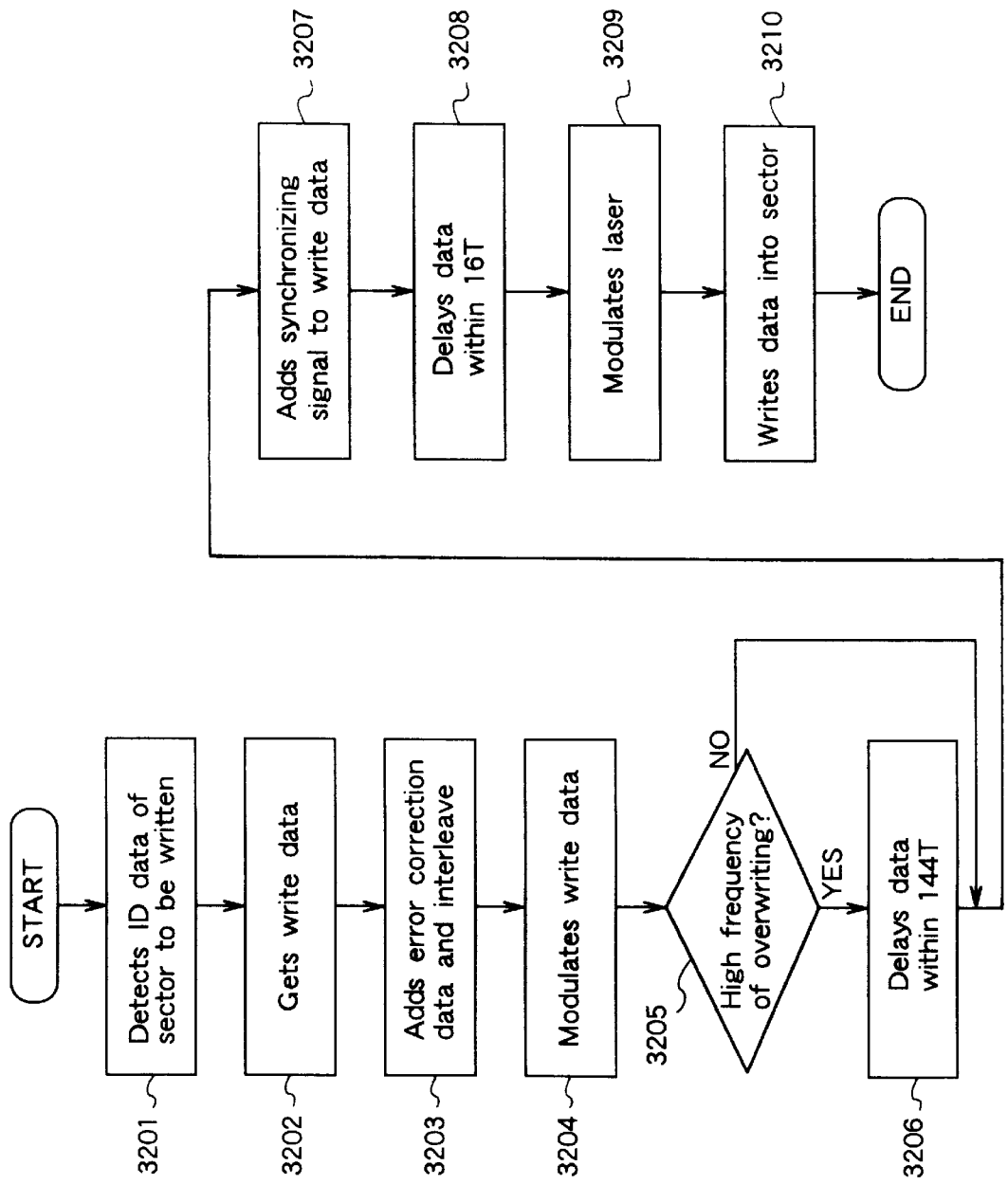
FIG. 32 is a flow chart showing a process for overwriting a sector of the optical disk in the apparatus shown in FIG. 31.

A block diagram of a writing and reading apparatus as a variation of this embodiment is shown in FIG. 31. This apparatus includes first and second delay time controller circuits 3101, 3102 before and after the synthesizer circuit 109. The first delay time controller circuit 3101 delays the modulated data signal within the variation range of 0–144T. The second delay time controller circuit 3102 delays the write data signal within the variation range of 0–16T. FIG. 32 shows a flow chart for overwriting a sector of the optical disk in the apparatus shown in FIG. 31. This flow chart shown in FIG. 32 differs from that of FIG. 2 in the following steps. The first delay time controller circuit 3101 delays the modulated data signal within the variation range of 0–144T only when the area to be written has a high frequency of overwriting (Step 3206). After the VFO 603 and the dummy data 605 are added to the write data (Step 3207), the second delay time controller circuit 3102 delays every data signal not depending on the frequency of overwriting, within the variation range of 0–16T (Step 3208).

Figure 34:
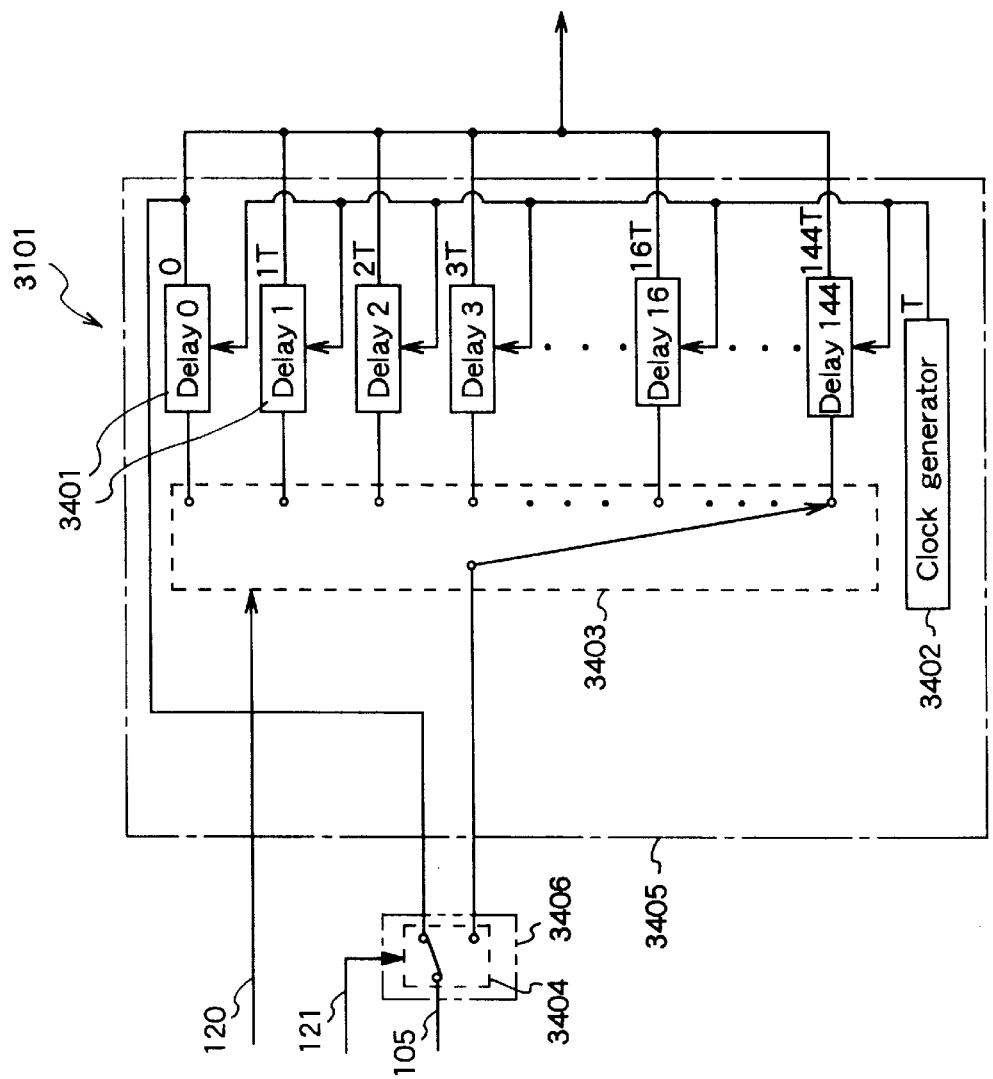
FIG. 34 shows an example of a first delay time controller circuit of the apparatus shown in FIG. 31.

FIG. 34 shows an example of the first delay time controller circuit 3101 of the apparatus shown in FIG. 31. In this block diagram, the selecting section is a switching circuit 3406. The write control section 3405 includes plural delay circuits 3401, a clock generator circuit 3402 that generate clock signals for the delay circuits 3401, and selector 3403 that selects one of the delay circuits 3401 for inputting the modulated data signal 105.

The delay times of the delay circuits 3401 are set to 0, T, 2T, . . . , 144T respectively based on the clock period T. In other words, the step width is T, and the total width is 144 T.

If the switching circuit 3404 selects the selector 3403, the write timing is altered at random within the delay time of 0–144T by one of delay circuits 3401 (First write timing). If the switching circuit 3404 does not select the selector 3403, the write data is outputted directly without passing through any delay circuit. In this case, the delay time is zero, and the write timing is constant (Second write timing).

The actual operation of the delay time controller circuit shown in FIG. 34 is as follows. When writing on the directory area of the optical disk 113, the switching circuit 3404 selects the selector 3403 according to the signal 121 from the identifier detector circuit 119. The delay time is selected at random from 144 steps 0–144T. The selected delay time is maintained until the next address is detected.

When writing on the general area of the optical disk 113, the switching circuit 3404 selects the direct pass to the output without passing through any delay circuit, so that the delay time is always zero.

Figure 35:
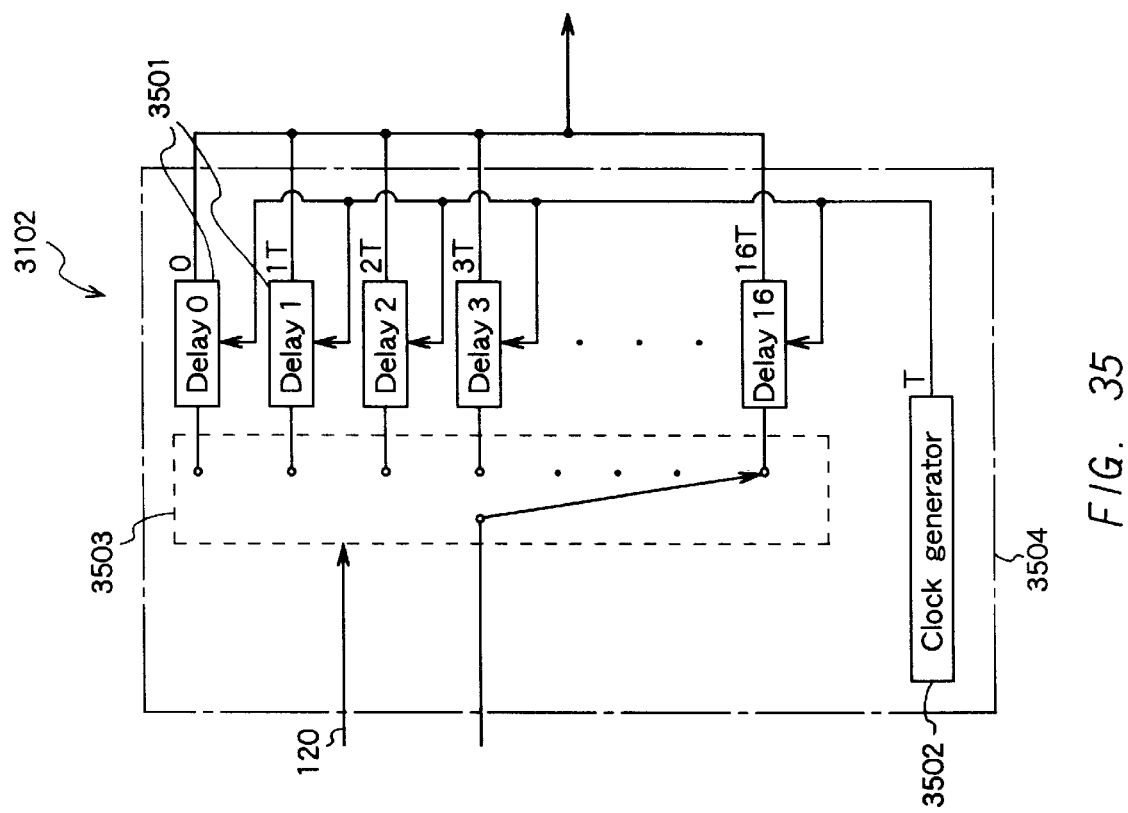
FIG. 35 shows an example of a second delay time controller circuit of the apparatus shown in FIG. 31.

FIG. 35 shows an example of the second delay time controller circuit 3102 of the apparatus shown in FIG. 31. In this block diagram, the write control section 3504 includes plural delay circuits 3501, a clock generator circuit 3502 that generate clock signals for the delay circuits 3501, and selector 3503 that selects one of the delay circuits 3501 for inputting the modulated data signal 105.

The delay times of the delay circuits 3501 are set to 0, T, 2T, . . . , 16T respectively based on the clock period T. In other words, the step width is T, and the total width is 16T.

In the actual operation, the delay time controller circuit shown in FIG. 35 works as follows. In every recording area of the optical disk, i.e., not depending on overwriting frequency, the selector 3503 selects one of 16 delay times 0–16T at random in accordance with the address detection signal 120 given by the system controller circuit. The selected delay time is maintained until the next address is detected.

By using two delay time controller circuits shown in FIG. 34 and 35, the number of steps of delay times can be changed, so that the variation range of the start point for writing is changed between 160T (144T+16T) for the directory area and 16T for the general area.

Record formats for this embodiment of FIG. 31 are explained below. When the variation range of the start point for writing is 16T, the record format is the same as shown in FIG. 11, in which (a) is in the case where the start point for writing didn't alter, and (b) is in the case where the start point for writing was delayed 16T.

Figure 33:
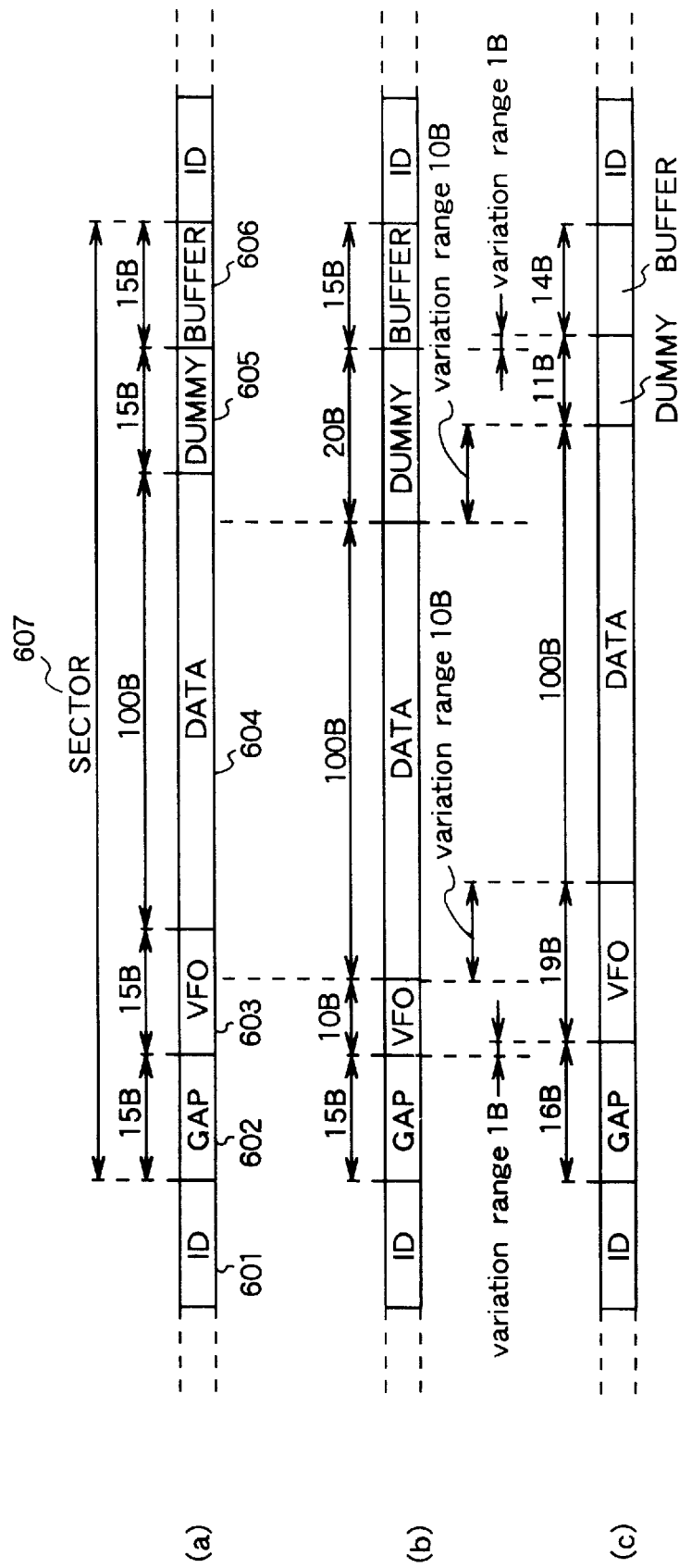
FIG. 33 (including subparts a–c) shows a record format when the variation range of the start point for writing was set at 160T in the apparatus shown in FIG. 31.

When the variation range of the start point for writing is 160T, the record format is as shown in FIG. 33. In this figure, (a) shows a record format in the case where the start point for writing was shifted forward by 80T, and (b) shows a record format in the case where the start point for writing was shifted backward (i.e., delayed) by 80T. In these cases, the start point for writing the VFO 603 and the dummy data 605 varies within the variation range of one byte, and the start point for writing in the data area varies within the variation range of ten bytes.

The configuration shown in FIG. 9 is preferable if the spindle motor 114 has a small jitter, or the laser driver circuit 110 has a capability of fast power control operation. On the contrary, if the jitter of the spindle motor 114 is not small, or the capability of the laser driver circuit 110 is not high, it is preferable to adopt the configuration shown in FIG. 1, and to secure the constant gap area 602 and buffer area 606 independently from the varying start point for writing as shown in FIGS. 7 and 8. The configuration shown in FIG. 31 ensures the gap area 602 and the buffer area 606 properly. Any configuration shown in FIG. 1, 9 or 31 according to the present invention can enhance the number of times of overwriting.

Another method for high-density recording has been proposed, where lands between guide grooves are also used for recording. In this case, a thermal stress generated at the periphery of the record mark is different between the guide groove and the land because their sections have different shapes at the periphery of the record mark. Therefore, the level of a deterioration generated after overwriting is different between the guide groove and the land even if the overwriting is repeated same times.

Figure 13:
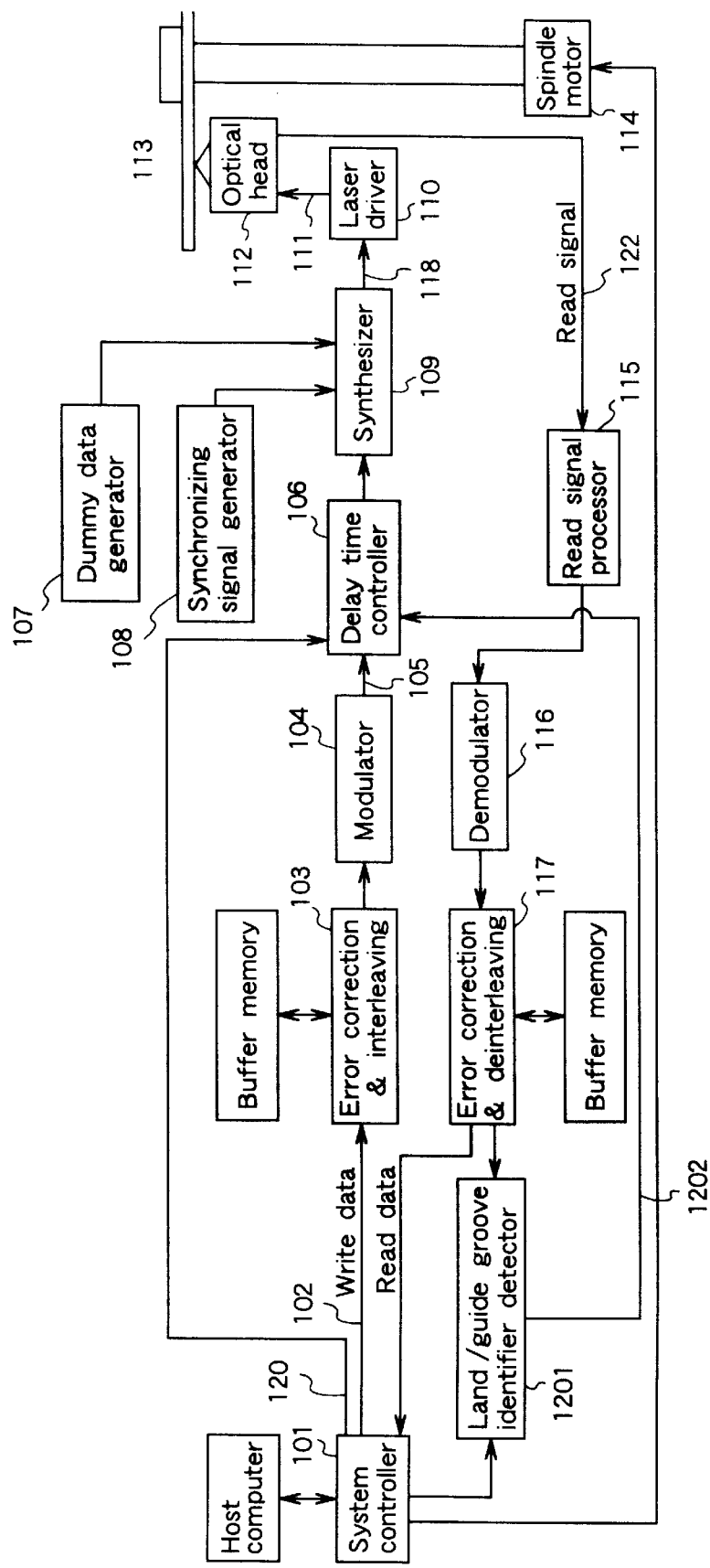
FIG. 13 is a block diagram of another variation of the writing and reading apparatus shown in FIG. 1.

To improve the above-mentioned problem, it may be preferable to adopt the configuration of the writing and reading apparatus shown in FIG. 13. This configuration differs from that of FIG. 1 in that the delay time controller circuit 106 set the variation range of the start point for writing in accordance with an identified result supplied from a land/guide groove identifier detector circuit 1201. In this case, the variation range of the start point for writing in the land is set different from that for writing in the guide groove, so that the number of times of overwriting is enhanced.

A pulse width modulation method in which both edges of the record mark have information is also proposed for a high-density recording. However, in this pulse width modulation method the recording film tend to wear earlier than in the pulse position modulation method in which the position of the record mark provides information, because the former usually makes longer marks than the latter. Moreover, the pulse width modulation cannot reproduce data correctly if the edge of the record mark is not detected precisely. Therefore, reproduction capability of the pulse width modulation is affected very much by the deterioration of the recording film. Thus, in the pulse width modulation it is more difficult to reproduce data correctly than in the pulse position modulation under the same deterioration level of the recording film.

Figure 14:
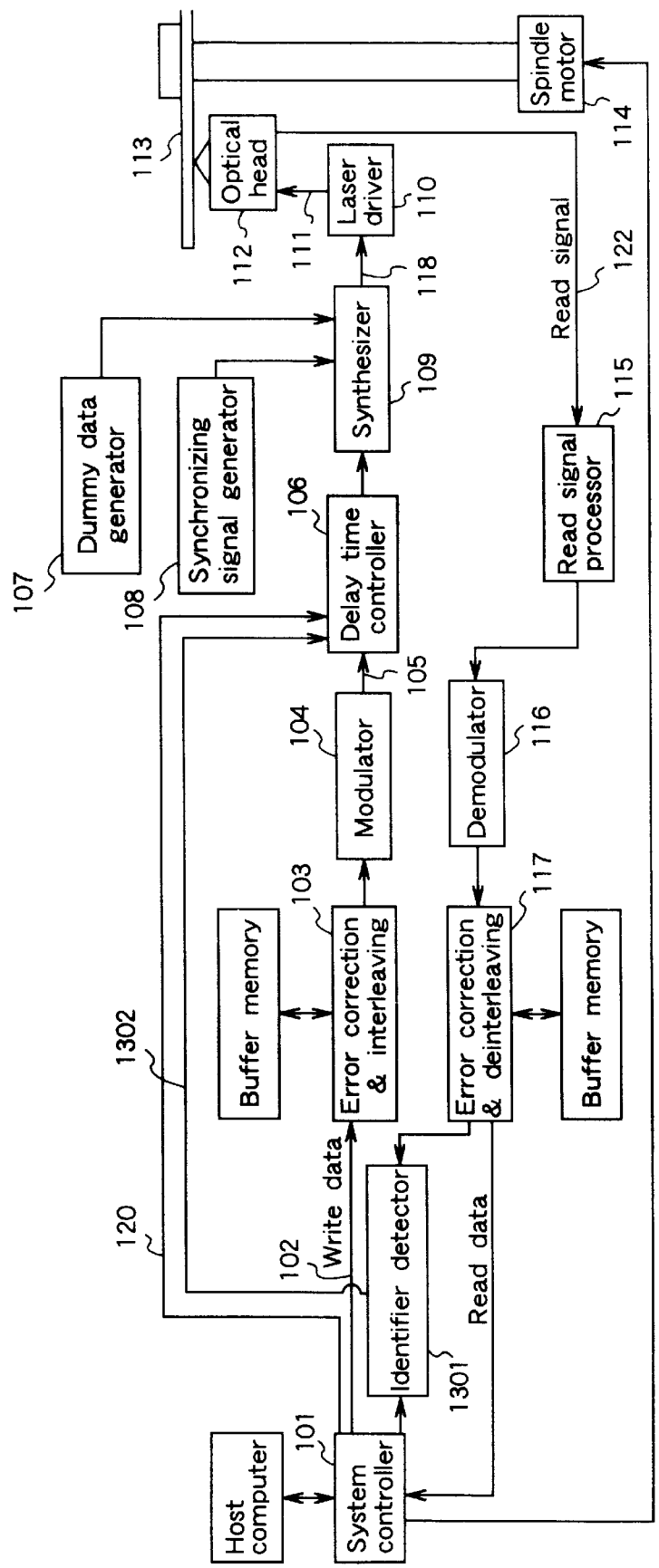
FIG. 14 is a block diagram of another variation of the writing and reading apparatus shown in FIG. 1.

Considering such a problem, it is also preferable to adopt a configuration of the writing and reading apparatus as shown in FIG. 14. This configuration differs from that shown in FIG. 1 in that the delay time controller circuit 106 sets the variation range of the start point for writing in accordance with a detection result by a modulation method identifier detector circuit 1301. In this case, the variation range of the start point for writing with the pulse width modulation is set different from that for writing with the pulse position modulation, so that the number of times of overwriting is enhanced.

The variation range of the start point for writing, the change step number, the change interval, or the record format mentioned above is an example, and the proper values should be selected for them according to the recording condition or medium. In addition, the variation range of the start point for writing can be changed among three or more values by combining the modulation method, the overwrite frequency, land/guide and other elements.

Second Embodiment

Figure 15:
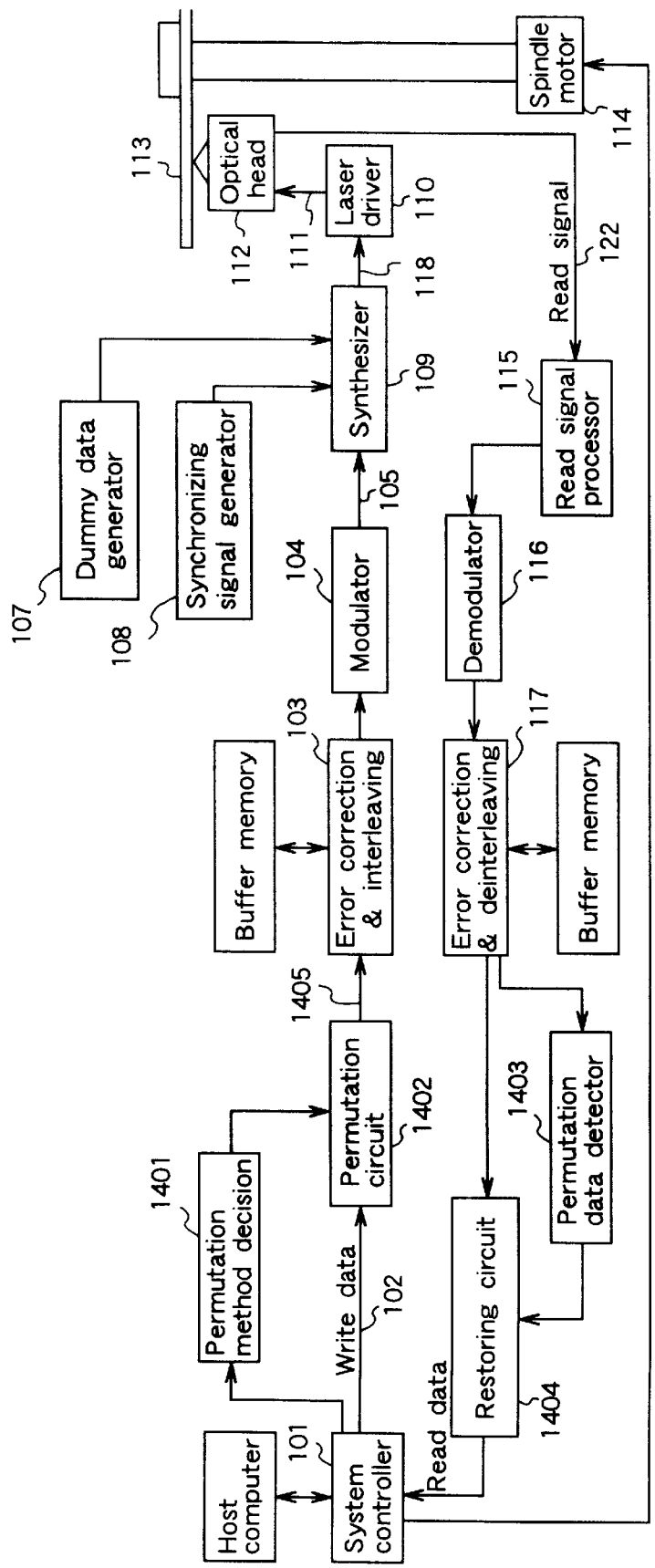
FIG. 15 is a block diagram of a writing and reading apparatus according to a second embodiment of the present invention.
Figure 16:
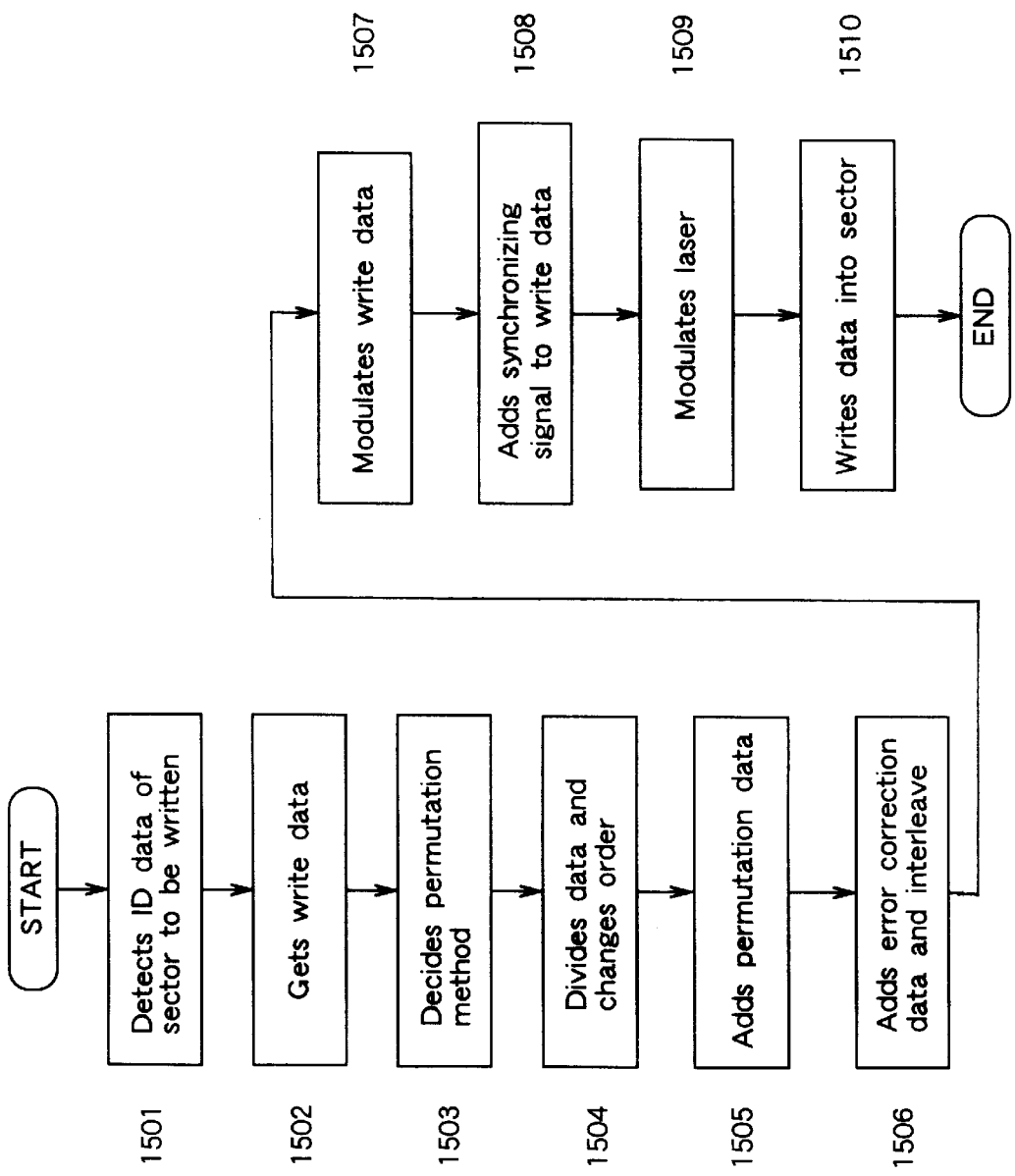
FIG. 16 is a flow chart showing a process for overwriting a sector of the optical disk in the apparatus shown in FIG. 15.

FIG. 15 shows a block diagram of an apparatus for writing on and recording an optical recording disk according to a second embodiment of the present invention. FIG. 16 shows a flow chart for overwriting a sector of the optical disk in the apparatus shown in FIG. 15.

This embodiment differs from the prior art in the following process. A permutation method decision circuit 1401 decides the permutation method of the write data 102 at random (Step 1503). A permutation circuit 1402 divides the write data into plural groups and changes the order of the groups according to an instruction from the permutation method decision circuit 1401 to obtain converted data 1405 (Step 1504). The permutation circuit 1402 also adds the permutation data as an identifier for restoring original data from the converted data (Step 1505).

Figure 17:
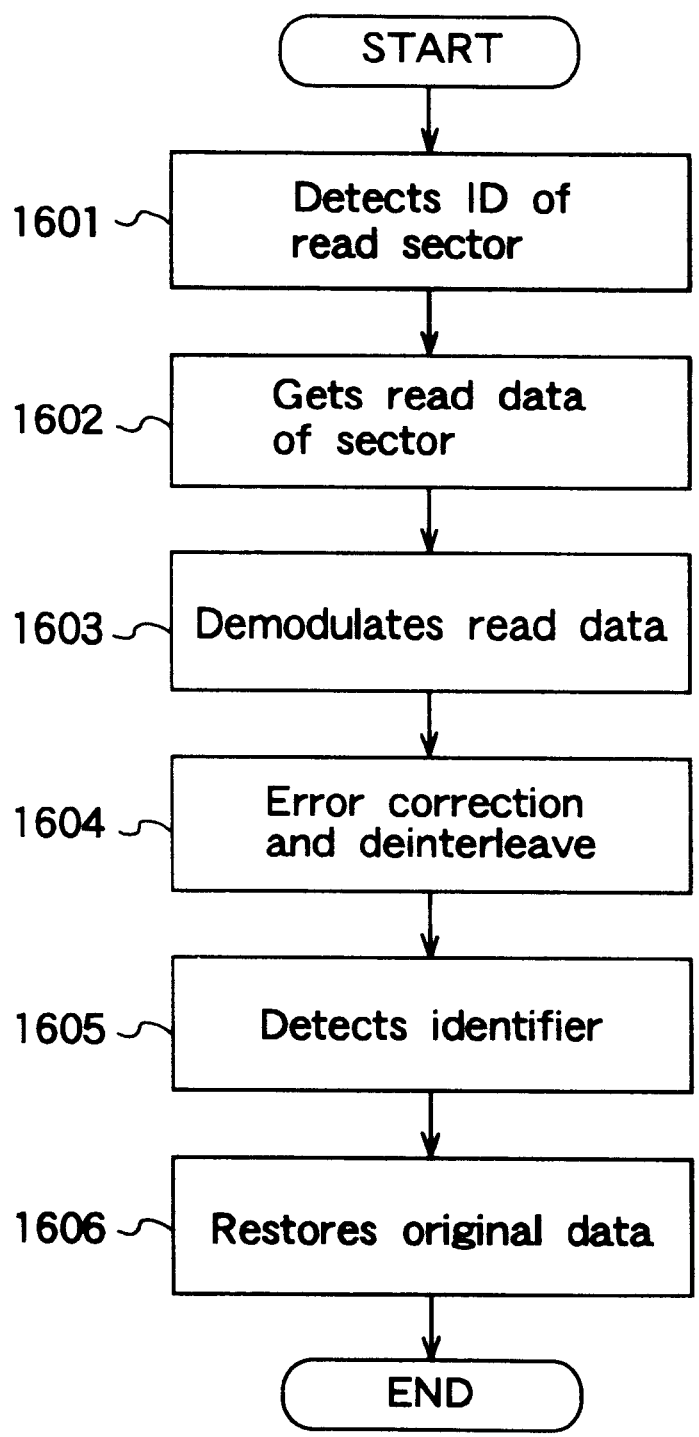
FIG. 17 is a flow chart showing a process for reproducing data written in a sector in the apparatus shown in FIG. 15.

FIG. 17 is a flow chart showing a process of reproducing a data written in a sector. This process differs from that of the prior art in the following steps. After error correction and deinterleaving (Step 1604), the permutation data detector circuit 1403 detects the permutation data that is the identifier for restoring the original data (Step 1605). A restoring circuit 1404 restores the original data based on the identifier (Step 1606).

Figure 18:
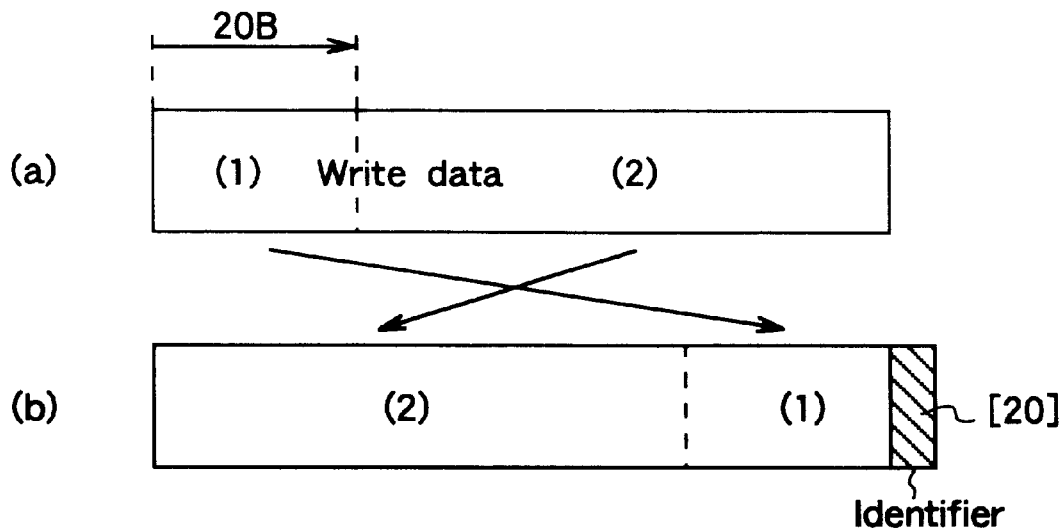
FIG. 18 (including subparts a–b) shows write data before permutation and the data after permutation in the apparatus shown in FIG. 15.

An example of the permutation and restoring of data is explained below using FIGS. 18 and 19.

The division and permutation of write data are performed as follows. Dividing positions are determined at random concerning a series of write data shown in (a) of FIG. 18. Then the series of write data is divided, changed in order, and provided with permutation data as an identifier showing the divided position, so as to make a series of data shown in (b) of FIG. 18. For example, if the write data are divided at the 20th byte and changed in order (this means a conversion method), an identifier showing the 20th byte is added to the converted data. It is not required to write the identifier into every sector. The identifier may be written into the directory (directory) area. The conversion method is not required to be changed for each sector, but can be same for plural sectors in a serial writing. Then, the error correction data are added and the interleave process is performed.

Figure 19:
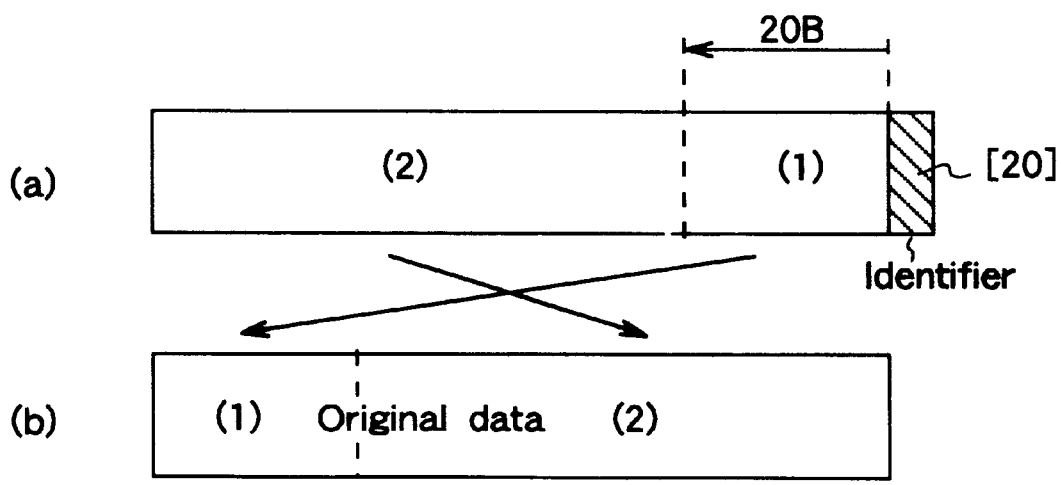
FIG. 19 (including subparts a–b) shows read data before restoring and the data after restoring in the apparatus shown in FIG. 15.

As shown in (a) of FIG. 19, when reproducing data, after error correction and deinterleaving, the identifier, i.e., permutation data, added to the tail of the converted data, are detected. For example, if the permutation data show the 20th byte, the last 20 bytes of the converted data are divided and added to the head of the data (this means a restoring method), so that the original data are obtained as shown in (b) of FIG. 19.

The dividing position is determined at random by the permutation circuit 1402 at every writing of a sector, so a different modulated data signal is used for each writing even if the same data are written into the same sector repeatedly. As a result, the optical disk 113 is written with different write data signals except the VFO and RESYNC areas. Therefore, a probability of forming a record mark 2501 on the guide groove 2303 is substantially uniform in a sector of the optical disk 113. Thus, local damage of the recording film due to repeated overwriting is relieved.

Figure 20:
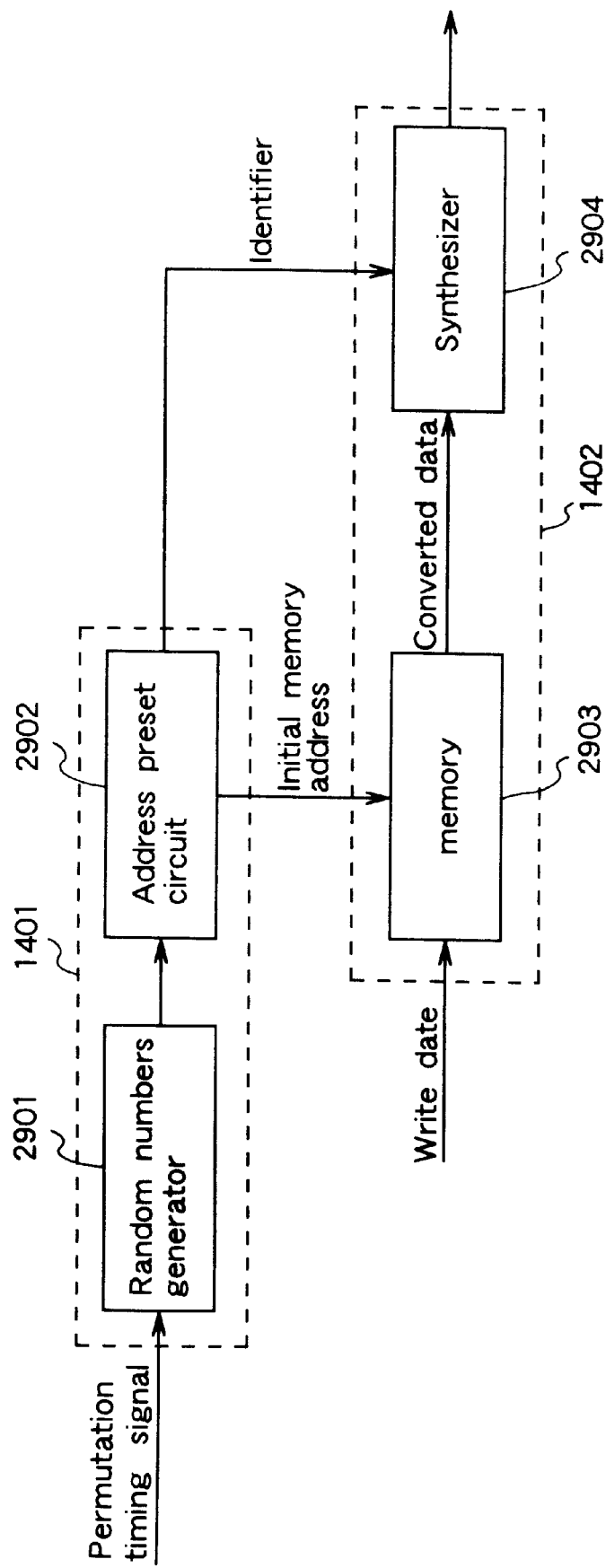
FIG. 20 is a block diagram of a permutation method decision circuit and a permutation circuit of the apparatus shown in FIG. 15.

FIG. 20 shows an example of the permutation method decision circuit 1401 and the permutation circuit 1402. In this figure, a random number generator 2901 generates random numbers, when being triggered by a permutation-timing signal. If each sector of the optical disk is accessed at random, a usual counter circuit can be used instead of the random number generator to obtain the same effect. An address preset circuit 2902 gives an initial memory address to a memory 2903 for reading the memory 2903. In the above-mentioned example, the initial memory address is an address corresponding to 20th byte from the head of the write data stored in the memory 2903. The memory 2903 stores the write data and outputs the stored data from the given initial memory address to the tail address and the remaining part of the data from the head address in order. Thus, the memory 2903 outputs the converted data. A synthesizer circuit 2904 add an identifier indicating the initial memory address to the data.

Figure 21:
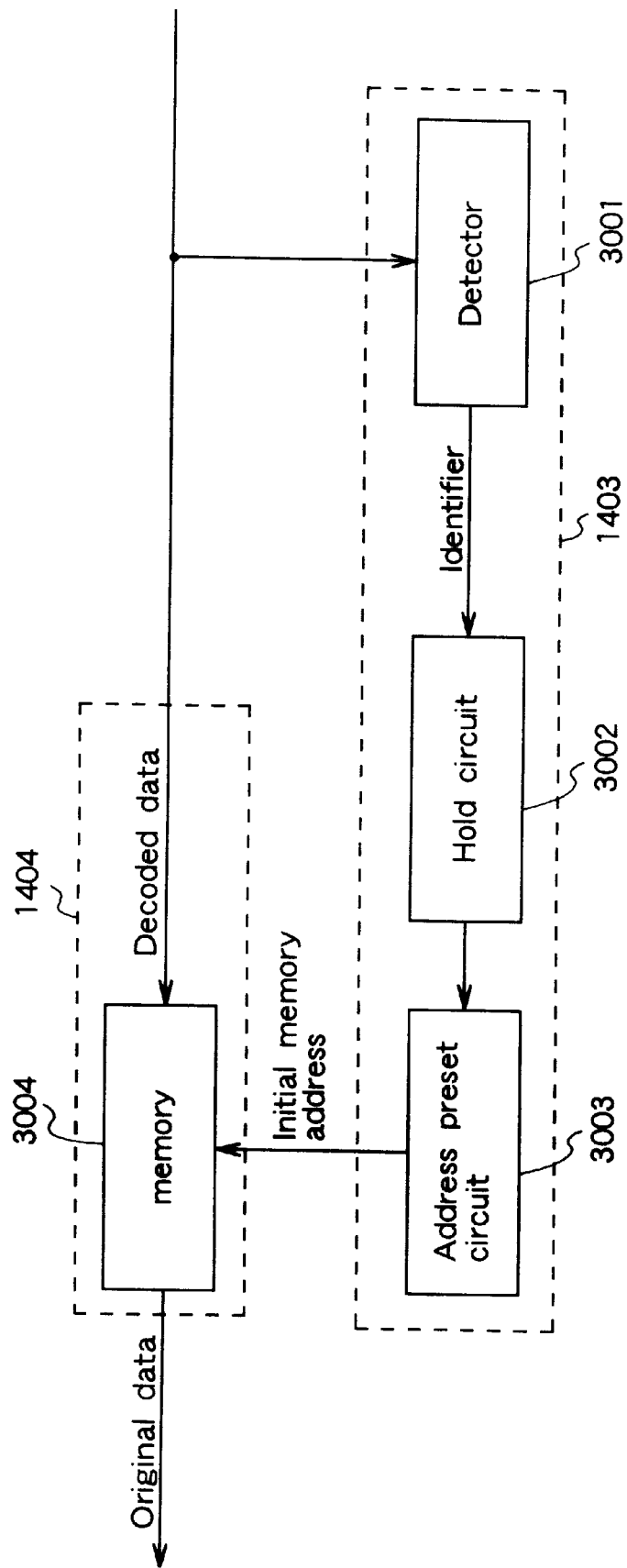
FIG. 21 is a block diagram of a permutation data detector circuit and a restoring circuit of the apparatus shown in FIG. 15.

FIG. 21 shows an example of the permutation data detector circuit 1403 and the restoring circuit 1404. A detector circuit 3001 detects the identifier from the decoded data after error correction and deinterleaving. A hold circuit 3002 holds the identifier and outputs the same to an address preset circuit 3003 until the next identifier is detected. The address preset circuit 3003 gives an initial memory address to a memory 3004. In the example mentioned above, the initial memory address is an address corresponding to 20th byte from the tail of the converted data stored in the memory 3004. The memory 3004 stores the converted data and outputs the stored data from the given initial memory address to the tail address and the remaining part of the data from the head address in order. Thus, the memory 3004 outputs the restored data.

Figure 22:
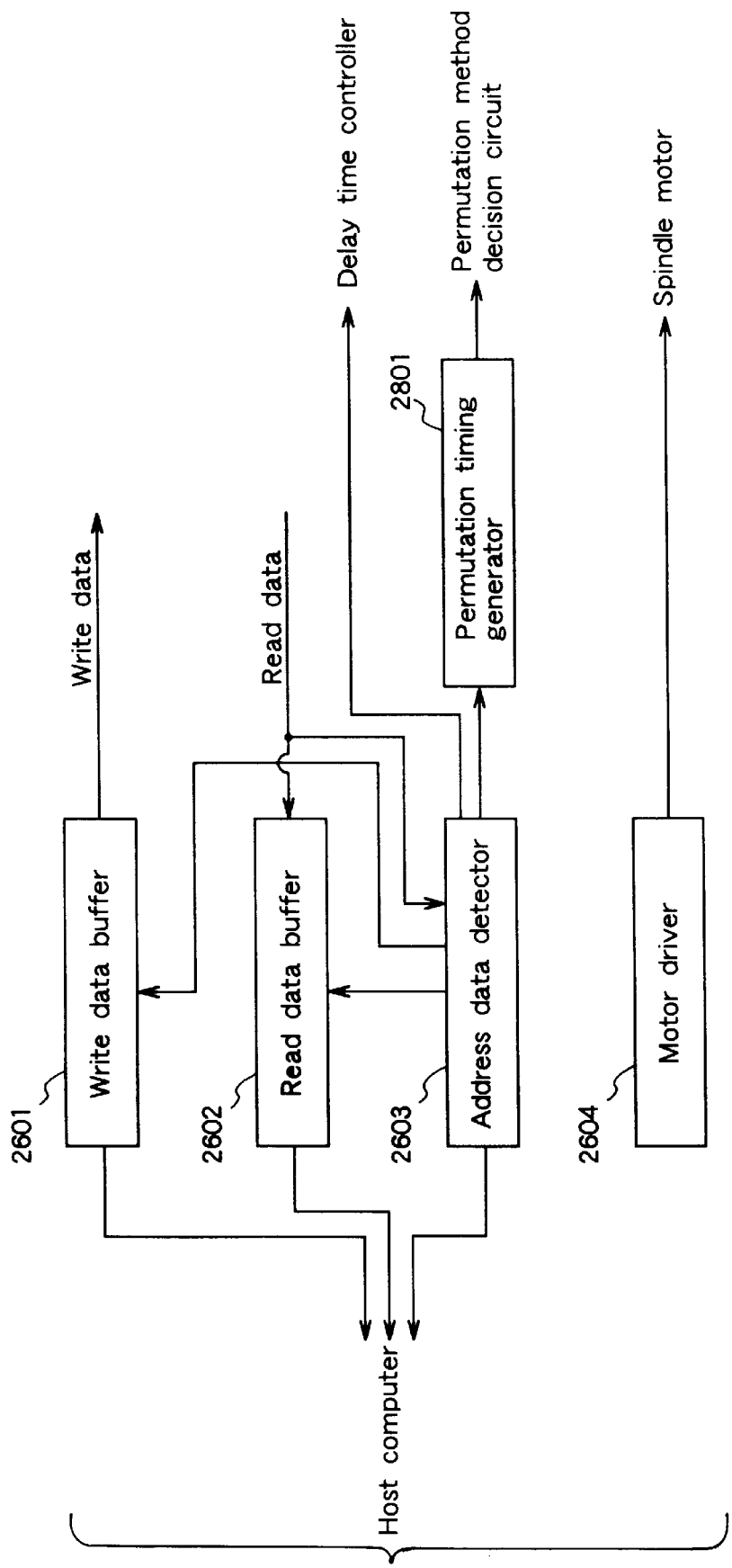
FIG. 22 is a block diagram of a system controller circuit of the apparatus shown in FIG. 15.

FIG. 22 shows the system controller circuit of this embodiment. This circuit differs from that of the prior art in that a permutation timing generator circuit 2801 outputs a permutation timing signal to the permutation method decision circuit 1401 in accordance with the address data and the address data detecting signal from the address data detector circuit 2603.

The following explanation is about an example for confirming the effect of this embodiment. The substrate of the optical disk 113 was made of a polycarbonate plate having a diameter of 130 mm. Pits are preformed on the substrate as address data, and guide grooves for writing are formed in sector areas. Four layers, that is a protective film, a photo-sensitive film, a protective film and a reflection film were formed on the substrate by sputtering. Then, a protective sheet was glued on the surface of the layers.

The protective film was made of $ZnS-SiO_2$, the photo-sensitive film was made of Te-Sb-Ge, and the reflection film was made of Al. This optical disk was rotated at a linear speed of 5 m/s by the spindle motor 113. A laser beam having a wavelength of 680 nm was used for writing, after being focused by an objective lens with a numerical aperture (N. A.) of 0.6. Laser powers for writing and reading were set at Pp=10 mW, Pb=4 mW, and Pr=1 mW. A method of (8–16) pulse width modulation was used for modulating the write data. The shortest mark length was 0.6 micron.

According to the above-mentioned condition, the write data were overwritten 100,000 times into the same sector. The error rate of demodulated data was measured for each overwriting with two methods for comparison. The first method used the permutation by dividing the write data and changing the order according to the present invention. The second method didn't use the permutation as the prior art. In both methods, the write data for a sector includes 500 bytes. In the first method using the permutation, the dividing position was selected at random by a step of one byte. The measured result is shown in Table 2.

TABLE 2

| | Error rate after 100,000 times overwrite |
|---|---|
| Without permutation | 0.011 |
| With permutation | 0.000002 |

As shown in Table 2, the first method with the permutation has smaller error rate than the second method without permutation, so that the number of times of overwriting is enhanced.

As mentioned above, according to the writing and reading method of the optical recording medium according to this embodiment of the present invention, the write data signals have different patterns by converting into plural patterns even if the same write data are written into the same sector of the optical recording medium repeatedly. As a result, a damage at a specific part of the recording film can be dispersed, and a deterioration of the recording film due to repeated overwriting can be reduced.

The number of divided blocks and other parameter in this embodiment is an example, and should be selected adequately in accordance with the record condition or medium.

The method for dividing a series of write data should not be limited to the example mentioned in this embodiment, but may be any method that can convert write data into plural different converted data.

Figure 23:
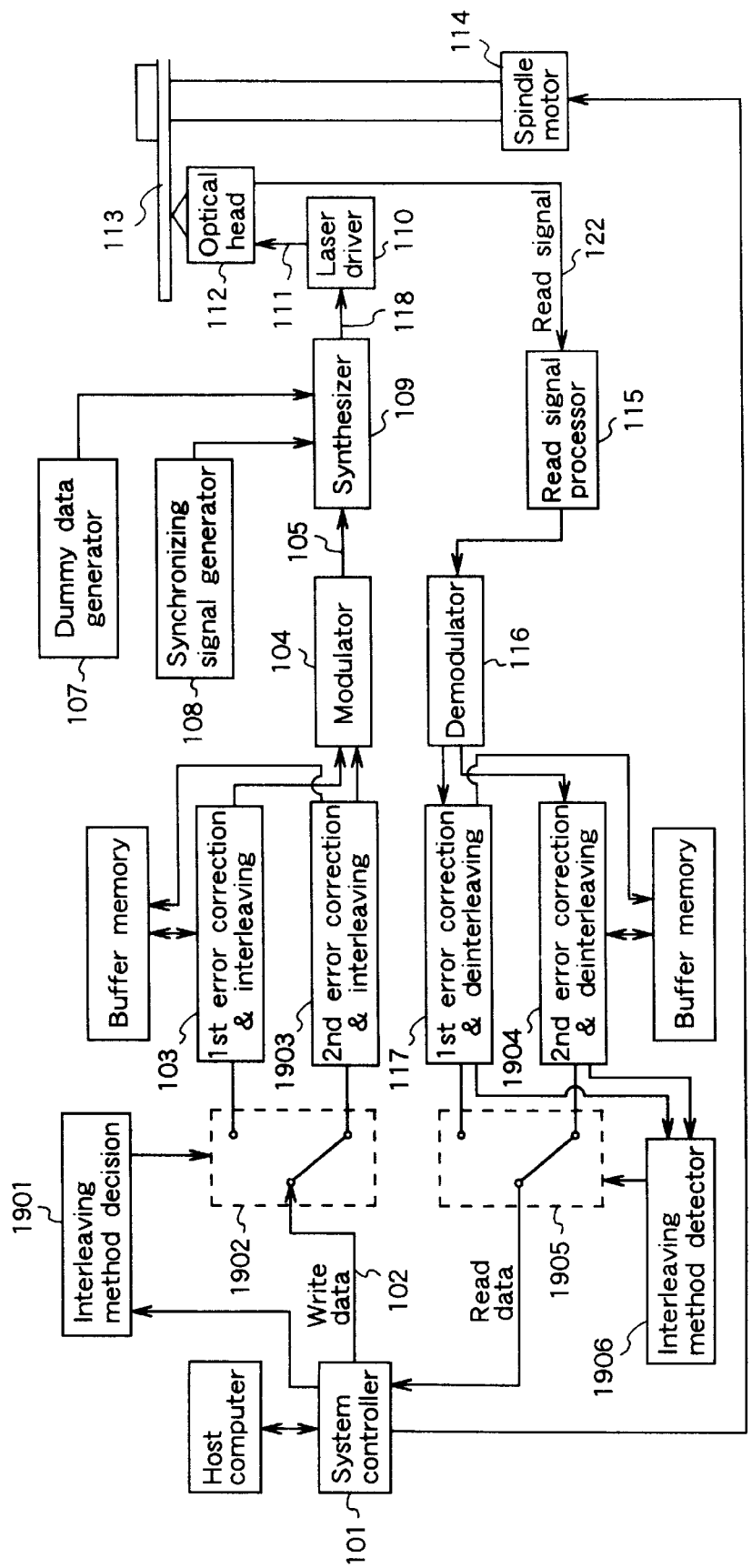
FIG. 23 is a block diagram of a variation of the writing and reading apparatus shown in FIG. 15.

For example, as shown in FIG. 23, a different interleaving method can be used by adding another pair of interleaving circuit and deinterleaving circuit to the configuration of FIG. 15. In the configuration shown in FIG. 23, one of two error correction and interleaving circuits 103, 1903 is selected by a first selecting circuit 1902 at random controlled by an interleaving method decision circuit 1901, and an identifier indicating the selected method is added to the converted data in the recording process. In the reproducing process, one of two error correction and deinterleaving circuits 117, 1904 is selected by a second selecting circuit 1905 according to the identifier detected by an interleaving method detector circuit 1906. The interleaving method decision circuit 1901 includes a random number generator circuit or a counter circuit in the same way as the permutation method decision circuit shown in FIG. 15.

Figure 24:
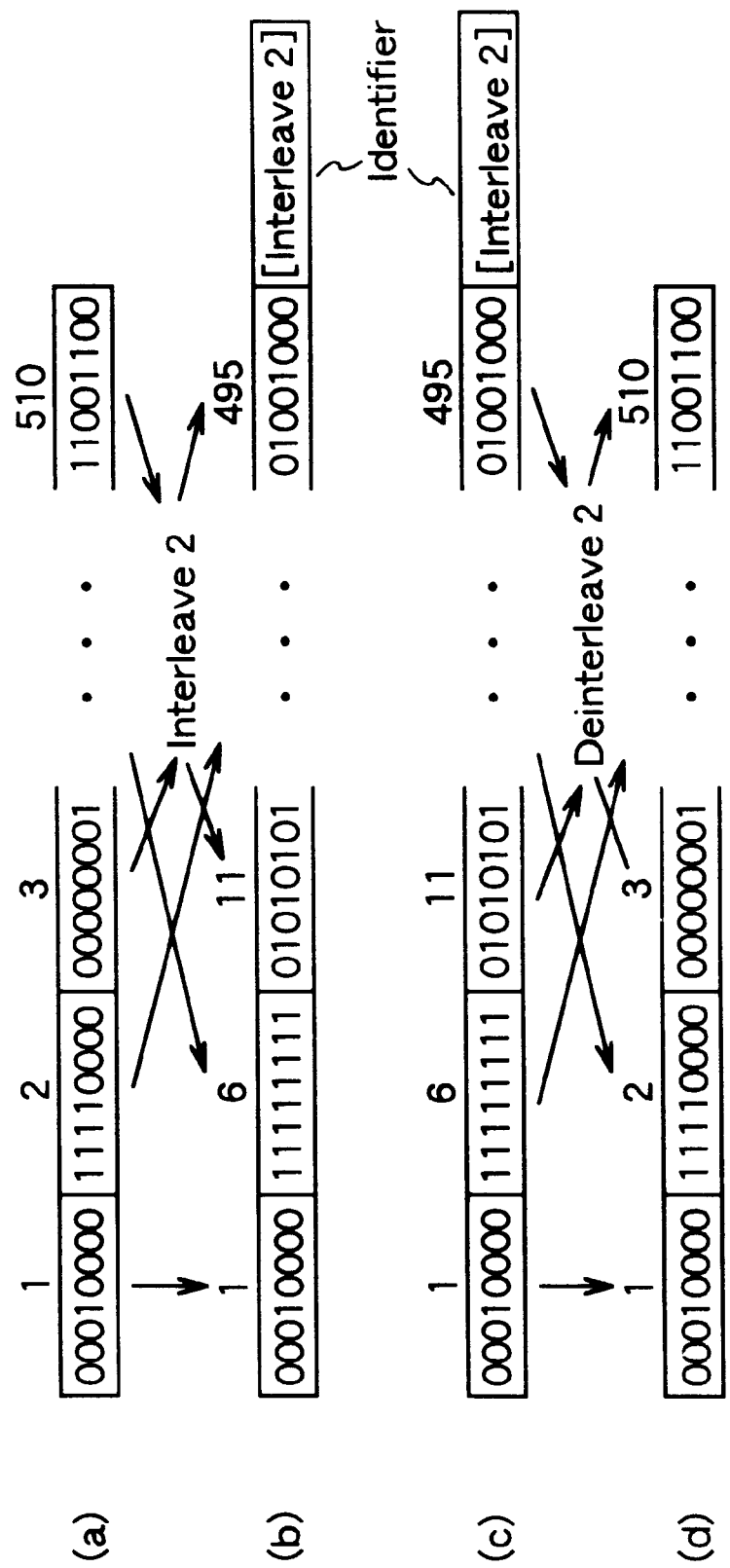
FIG. 24 (including subparts a–d) shows an example of interleaving and deinterleaving operations in the apparatus shown in FIG. 23.

FIG. 24 shows an example of interleaving and deinterleaving operations. In FIG. 24, (a) shows write data before interleaving, (b) shows the data after interleaving and provided with an identifier indicating the interleaving method, (c) shows read data before deinterleaving, and (d) shows data after deinterleaving in accordance with the detected identifier. In this case, the same process as the interleaving can perform division and permutation of the write data, so that the configuration of the writing and reading apparatus can be simplified.

The method for converting a series of write data into one of two or more different series of converted data may be the following method.

Figure 25:
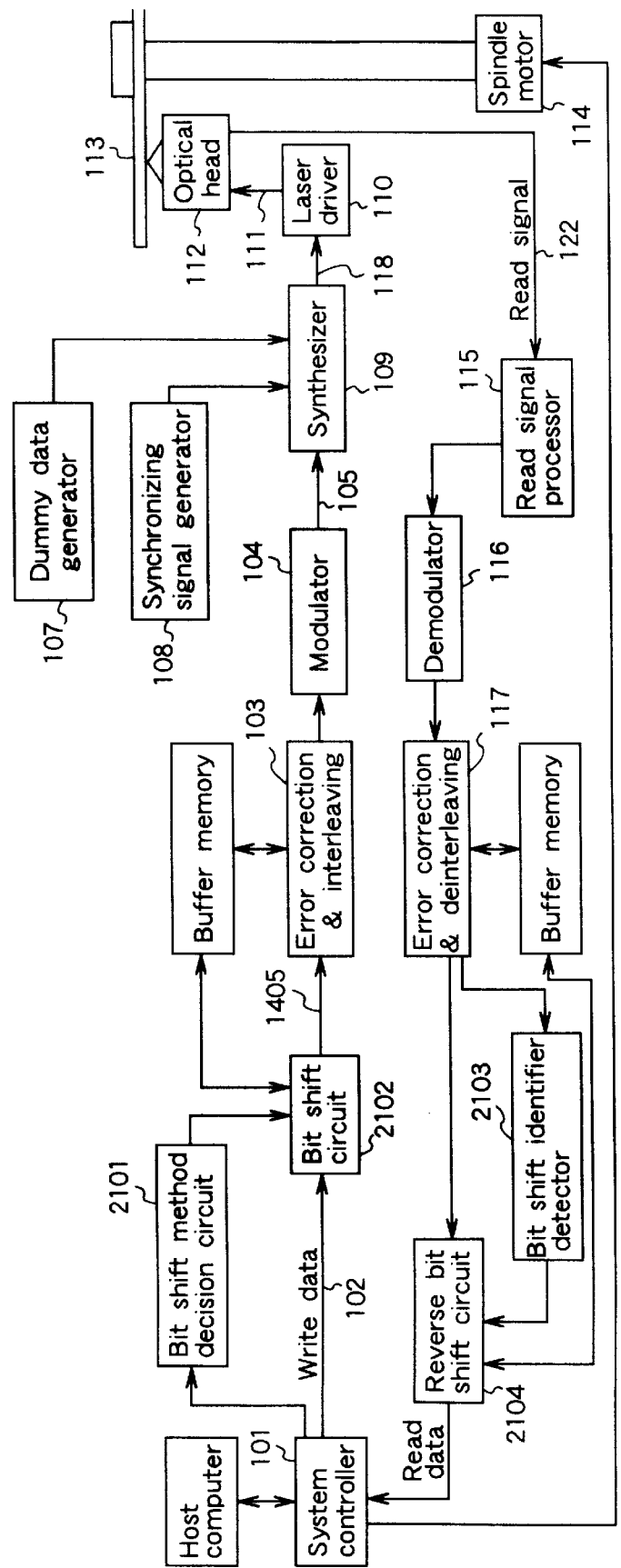
FIG. 25 is a block diagram of another variation of the writing and reading apparatus shown in FIG. 15.

FIG. 25 shows a configuration for generating a series of converted data from a series of write data by a scrambling method, which comprises a bit shift process of the write data. In the recording process, a bit shift method decision circuit 2101 decides a shift bit number at random, and a bit shift circuit 2102 performs the bit shift process by a unit of one or more bits according to the decided shift bit number to obtain converted data 1405. An identifier indicating the shift bit number is added to the converted data. These steps correspond to the converting method. In the reproducing process, a bit shift identifier detector circuit 2103 detects the identifier, and a reverse bit shift circuit 2104 performs the reverse bit shift process by a unit of one or more bits according to the detected identifier. These steps correspond to the restoring method. The bit shift method decision circuit 2101 includes a random number generator circuit or a counter circuit in the same way as the permutation method decision circuit shown in FIG. 15.

Figure 26:
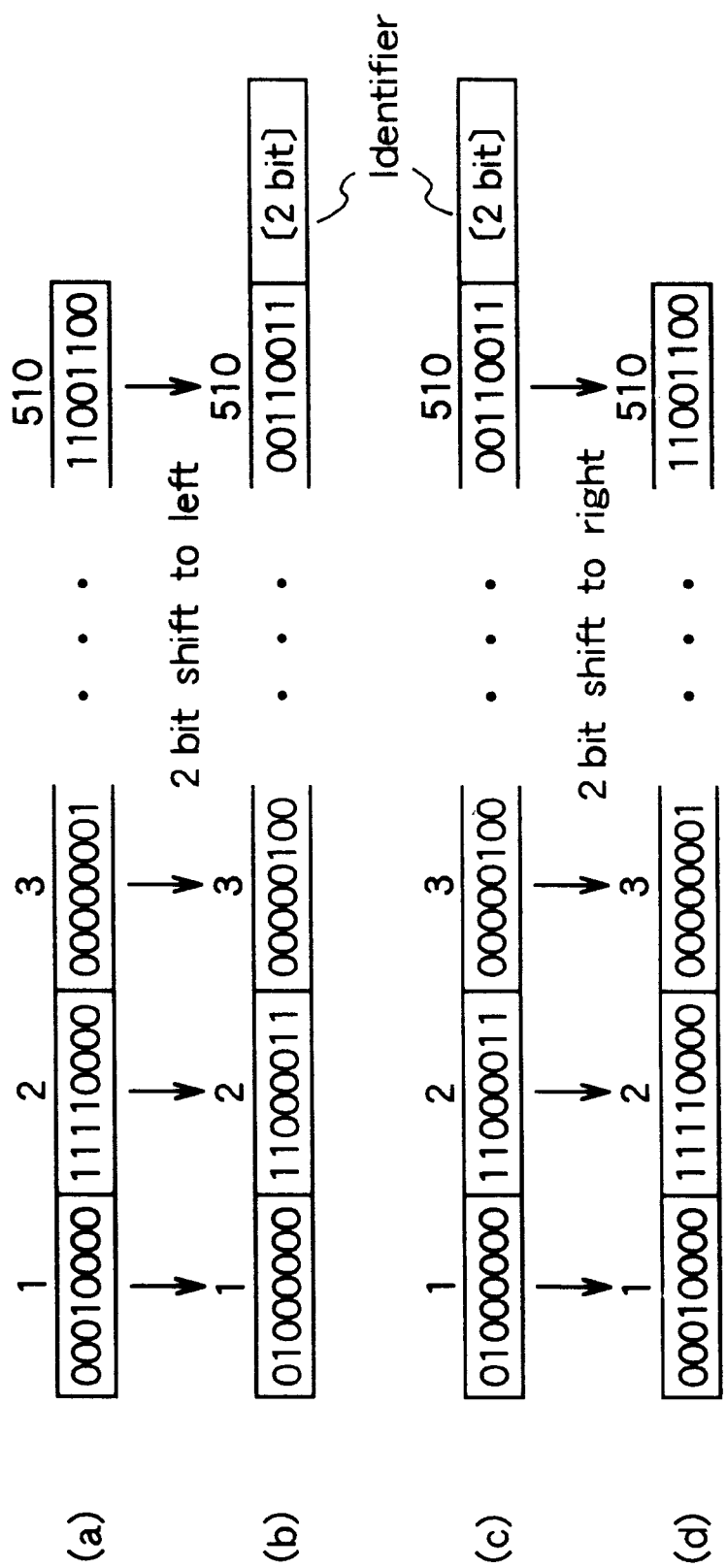
FIG. 26 (including subparts a–d) shows an example of bit shift and reverse bit shift operations in the apparatus shown in FIG. 25.
Figure 27:
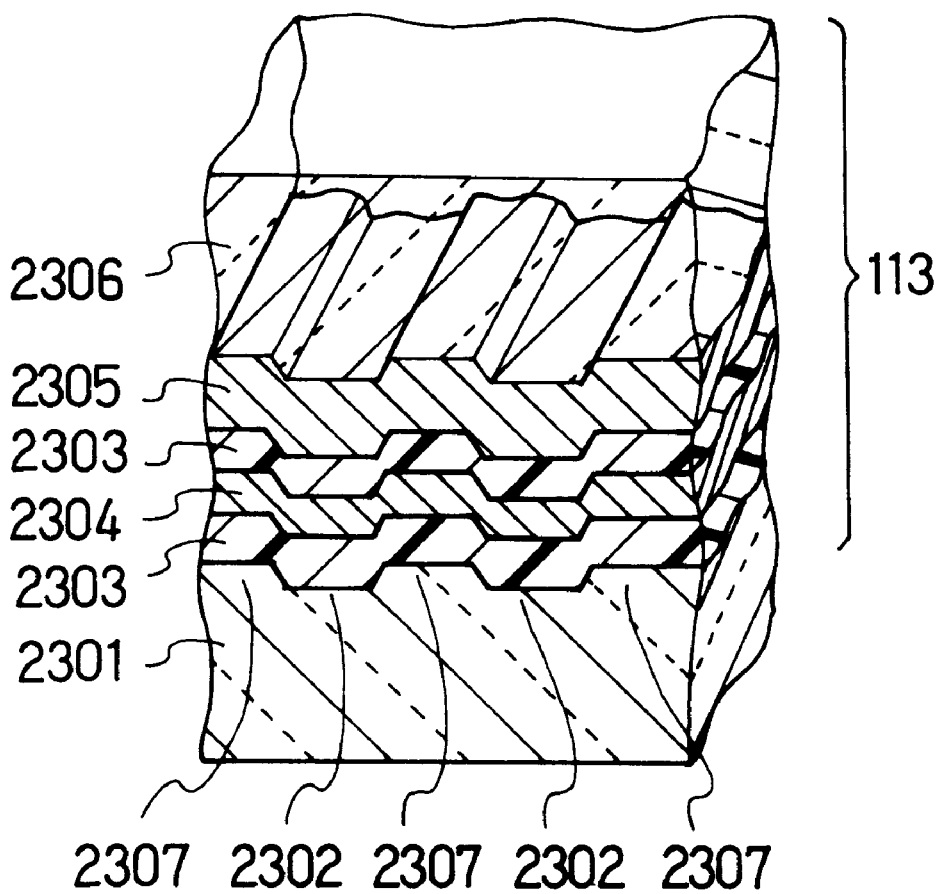
FIG. 27 is a cross section of an optical disk using a phase-change type recording film in the prior art.

FIG. 26 shows an example of the bit shift and reverse bit shift operations. In FIG. 26, (a) shows write data before bit shift, (b) shows the data after bit shift and provided with an identifier indicating the bit shift method, (c) shows read data before reverse bit shift, and (d) shows data after reverse bit shift in accordance with the detected identifier. In this case, a large memory for permutation is not required, so that the configuration of the writing and reading apparatus can be simplified.

In the second embodiment, by changing the start point for writing a sector with a modulated data signal at random, the RESYNC area included in the data area can also be written in a different position, so the number of times of overwriting is further enhanced.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. An apparatus for writing data on and reading data from an overwritable optical recording medium having a sector format, comprising:

a modulator portion modulating data to make a modulated data signal corresponding to a record pattern of an optical recording medium:

a synchronizing signal generating portion generating a synchronizing signal to be added before the modulated data signal;

a delay portion performing a first function of delaying a start point for writing the modulated data signal into a sector on an optical recording medium at random within a first variation range, and a second function of delaying a start point for writing the modulated data signal into a sector on an optical recording medium at random within a second variation range that is larger than the first variation range; and a switching portion selecting one of the first function and the second function of the delay portion;

wherein a start point for writing the synchronizing signal on an optical recording medium is delayed within a synchronizing signal variation range that is smaller than a variation range of a start point for writing the modulated data signal.

* * * * *